United States Patent
Wu

(10) Patent No.: US 11,152,569 B2
(45) Date of Patent: Oct. 19, 2021

(54) PCRAM STRUCTURE WITH SELECTOR DEVICE

(71) Applicant: TAIWAN SEMICONDUCTOR MANUFACTURING CO., LTD., Hsinchu (TW)

(72) Inventor: Jau-Yi Wu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 73 days.

(21) Appl. No.: 15/885,001

(22) Filed: Jan. 31, 2018

(65) Prior Publication Data

US 2019/0165264 A1 May 30, 2019

Related U.S. Application Data

(60) Provisional application No. 62/592,964, filed on Nov. 30, 2017.

(51) Int. Cl.
*H01L 45/00* (2006.01)
*H01L 27/24* (2006.01)

(52) U.S. Cl.
CPC ........... *H01L 45/126* (2013.01); *H01L 27/24* (2013.01); *H01L 27/2409* (2013.01);
(Continued)

(58) Field of Classification Search
CPC ... H01L 45/126; H01L 27/2409; H01L 27/24; H01L 27/2481; H01L 27/2427;
(Continued)

(56) References Cited

U.S. PATENT DOCUMENTS

| 7,560,581 | B2 * | 7/2009 | Gordon | ................ | C07F 11/005 |
| | | | | | 257/761 |
| 2006/0068575 | A1 * | 3/2006 | Gluschenkov | ...... | H01L 29/4958 |
| | | | | | 438/585 |

(Continued)

FOREIGN PATENT DOCUMENTS

| DE | 10 2016 114 156 A1 | 4/2017 |
| KR | 100809437 B1 | 3/2008 |

(Continued)

OTHER PUBLICATIONS

Dooho Choi at al., Electron mean free path of tungsten and the electrical resistivity of epitaxial (110) tungsten films, 2012, American Physical Society, Physical Review B 86, 045432 (Year: 2012).*

*Primary Examiner* — Khaja Ahmad
*Assistant Examiner* — Pavel G Ivanov
(74) *Attorney, Agent, or Firm* — McDermott Will & Emery LLP

(57) ABSTRACT

A memory device includes a substrate; a bottom electrode disposed over the substrate; an insulating layer disposed over the bottom electrode, the insulating layer having a through hole defined in the insulating layer; a heater disposed in the through hole; a phase change material layer disposed over the heater; a selector layer disposed over the phase change material layer; and a metal layer disposed over the selector layer. The metal layer is wider than the phase change material layer.

18 Claims, 18 Drawing Sheets

(52) U.S. Cl.
CPC ...... *H01L 27/2427* (2013.01); *H01L 27/2481* (2013.01); *H01L 45/06* (2013.01); *H01L 45/1233* (2013.01); *H01L 45/1608* (2013.01); *H01L 45/144* (2013.01); *H01L 45/148* (2013.01); *H01L 45/1675* (2013.01); *H01L 45/1683* (2013.01)

(58) Field of Classification Search
CPC . H01L 45/06; H01L 45/1233; H01L 45/1608; H01L 45/1683; H01L 45/144; H01L 45/1675; H01L 45/148
See application file for complete search history.

(56) References Cited

U.S. PATENT DOCUMENTS

| | | | | |
|---|---|---|---|---|
| 2006/0246712 | A1* | 11/2006 | Kim | H01L 27/2427 438/622 |
| 2007/0052009 | A1* | 3/2007 | Xie | H01L 27/2436 257/318 |
| 2007/0158698 | A1* | 7/2007 | Dennison | H01L 45/04 257/246 |
| 2007/0200108 | A1* | 8/2007 | Noh | G11C 13/0004 257/4 |
| 2007/0292985 | A1* | 12/2007 | Zhang | H01L 27/2427 438/95 |
| 2008/0248632 | A1* | 10/2008 | Youn | H01L 45/1233 438/483 |
| 2009/0267047 | A1* | 10/2009 | Sasago | H01L 27/2409 257/4 |
| 2011/0032753 | A1* | 2/2011 | An | G11C 11/56 365/163 |
| 2012/0281452 | A1* | 11/2012 | Huo | H01L 27/2463 365/148 |
| 2013/0270504 | A1* | 10/2013 | Bresolin | H01L 45/1233 257/2 |
| 2015/0263069 | A1* | 9/2015 | Jo | G11C 13/003 365/148 |
| 2017/0117328 | A1 | 4/2017 | Terai | |
| 2017/0250222 | A1 | 8/2017 | Wu et al. | |

FOREIGN PATENT DOCUMENTS

| | | | |
|---|---|---|---|
| KR | 20080028544 A | | 4/2008 |
| KR | 20090009459 A | * | 1/2009 |

* cited by examiner

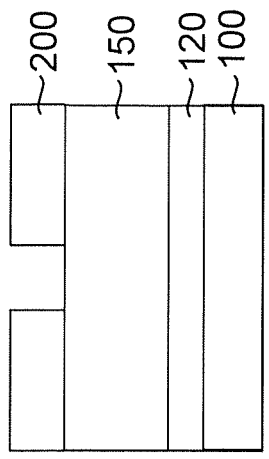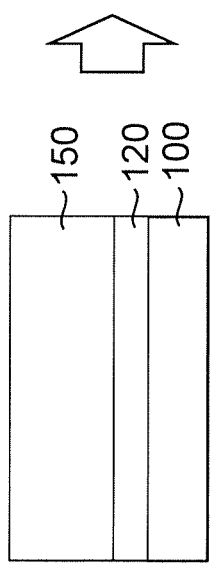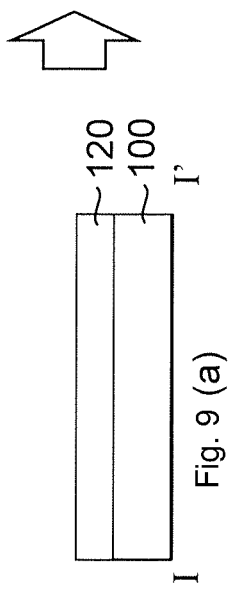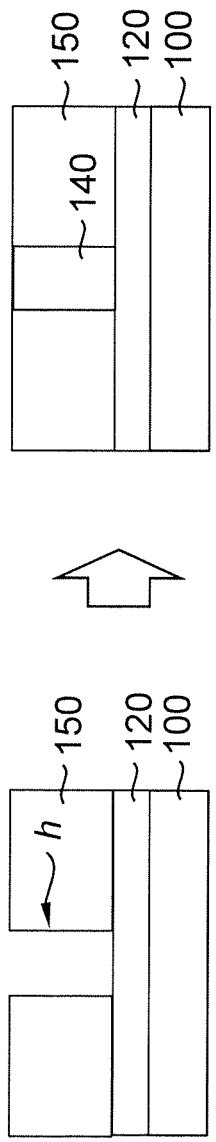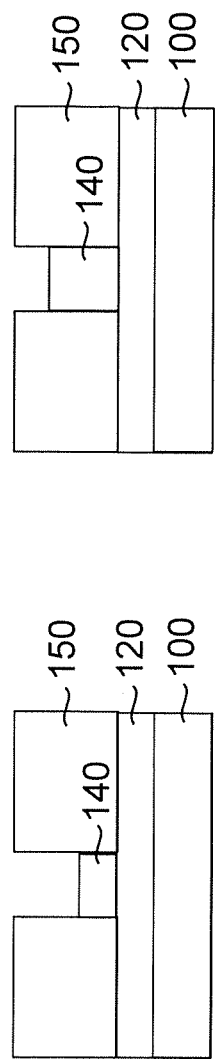

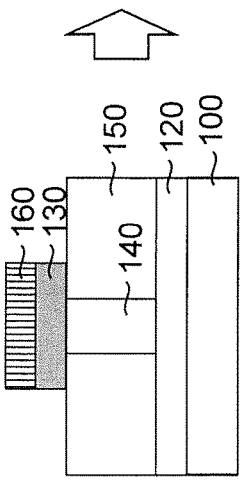
Fig. 10 (a)
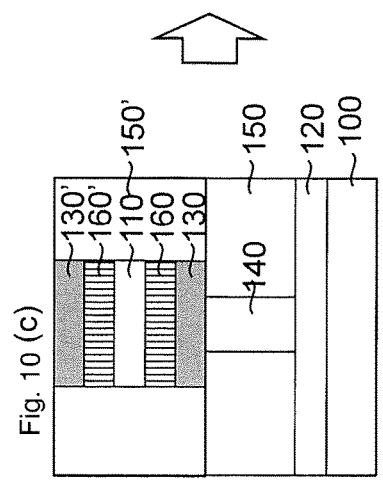
Fig. 10 (b)
Fig. 10 (c)
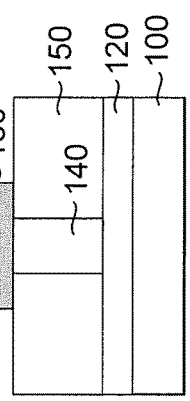
Fig. 10 (d)
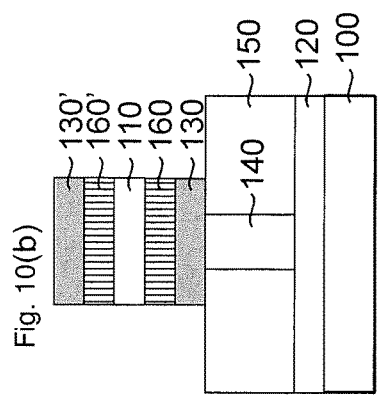
Fig. 10 (e)
Fig. 10 (f)
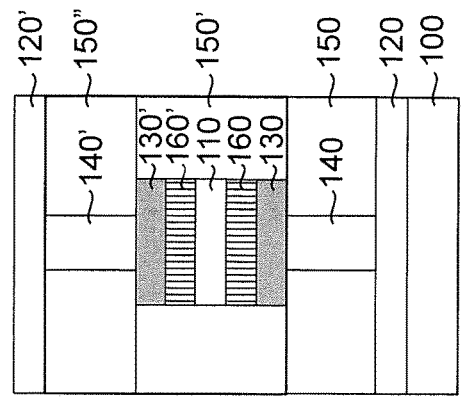
Fig. 10 (g)
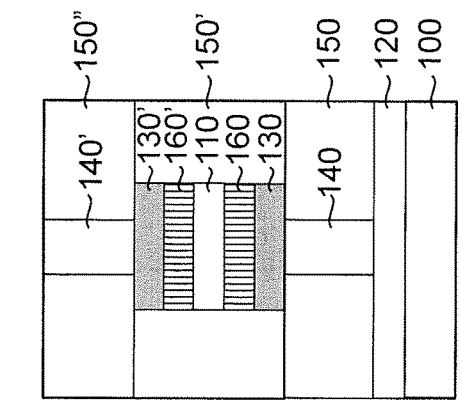
Fig. 10 (h)
Fig. 10 (i)

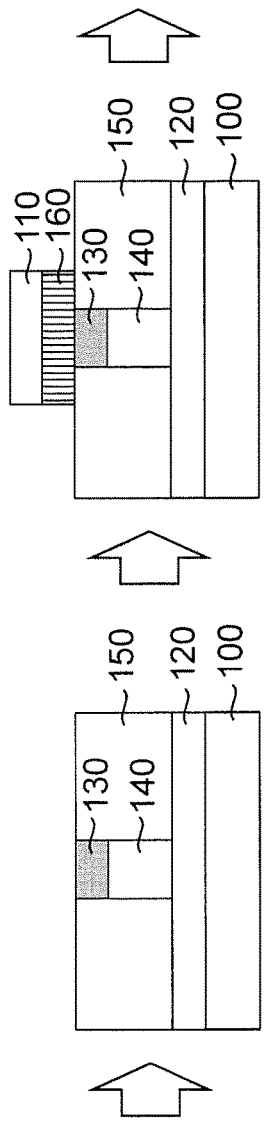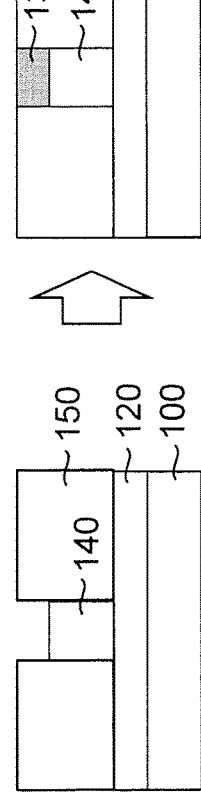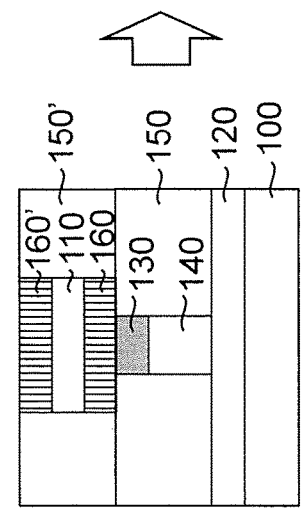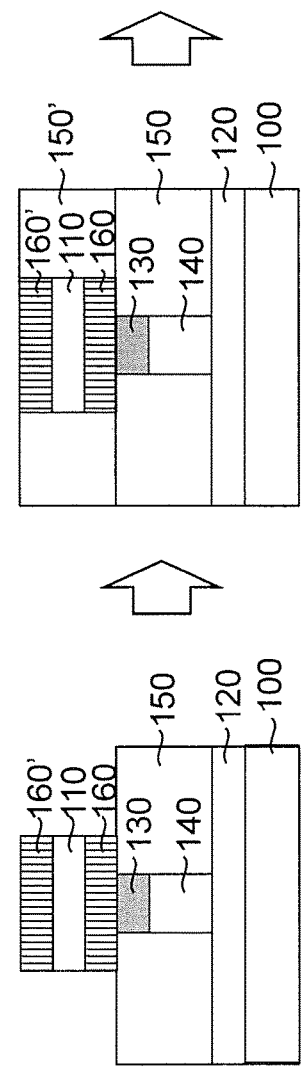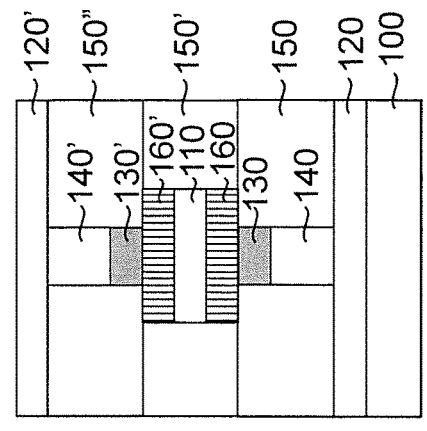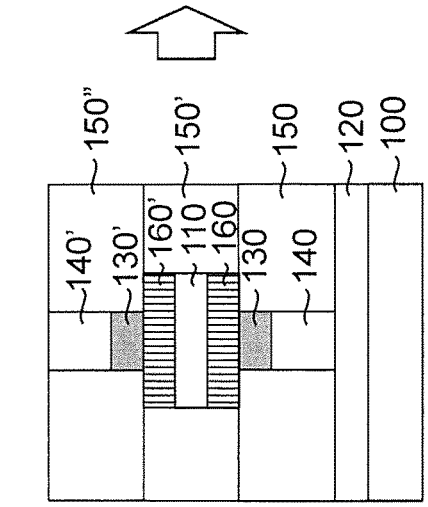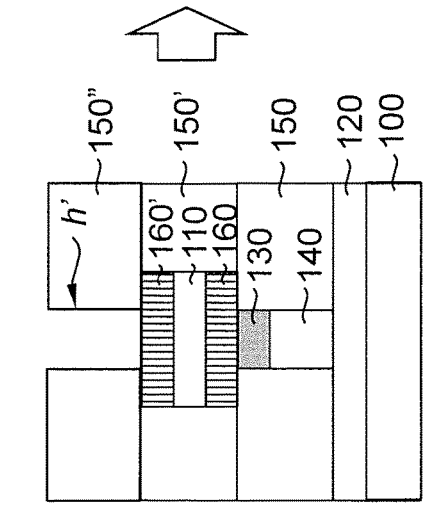

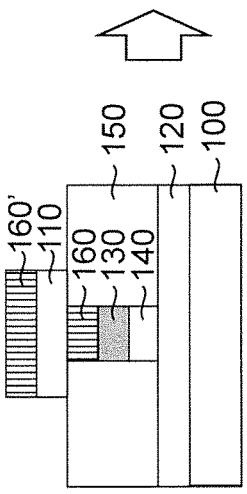
Fig.12 (a)
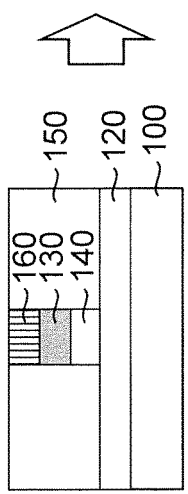
Fig.12 (b)
Fig.12 (c)
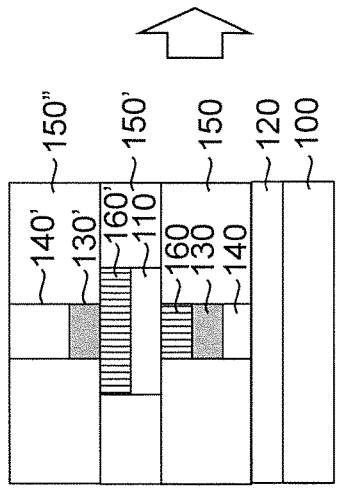
Fig.12 (d)
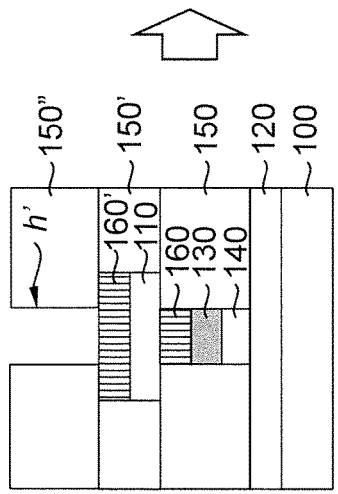
Fig.12 (e)
Fig.12 (f)
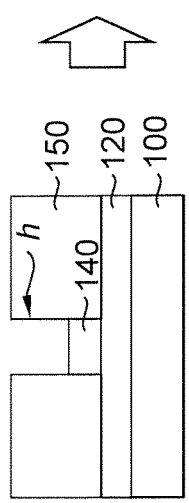
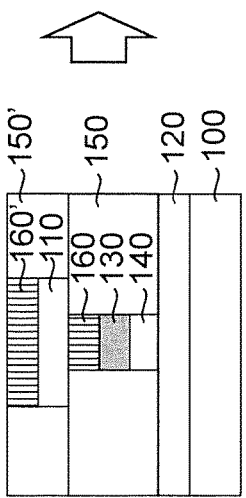
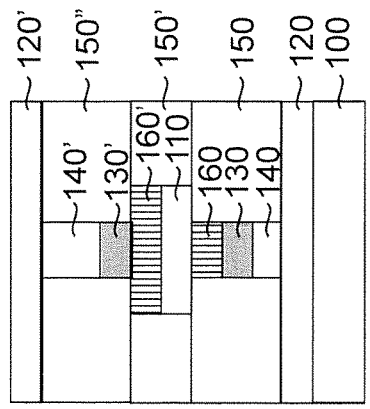
Fig.12 (g)

PCRAM STRUCTURE WITH SELECTOR DEVICE

RELATED CASE

The present application claims priority to and incorporates by reference the following U.S. Provisional Application 62/592,964 filed on Nov. 30, 2017.

TECHNICAL FIELD

The disclosure relates to device of a phase change random access memory (PCRAM) with a selector device and method of manufacturing the same.

BACKGROUND

Phase change random access memory (PCRAM) is a non-volatile memory device making use of different resistive phases and heat induced phase transition between the phases of phase change materials including chalcogenide and resistive materials. A PCRAM is composed of many cells each of which functions independently. A PCRAM cell mainly includes a heater and a resistor which is a data storage element made mainly of a reversible phase change material to provide at least two dramatically different resistivities for logical "0" state and "1" state.

To read a state (data) from the PCRAM cell, a sufficiently small current is applied to the phase change material without triggering the heater to generate heat. In this way, the resistivity of the phase change material can be measured and the states representing the resistivities, i.e. a "0" state for high resistivity or a "1" state for low resistivity can be read.

To write a state (data) in the PCRAM cell, for example, to write a "1" state representing a low resistivity phase of the phase change material, a medium electric current is applied to the heater which generates heat for annealing the phase change material at a temperature above the crystallization temperature but below the melting temperature of the phase change material for a time period to achieve a crystalline phase. To write a "0" state representing a high resistivity phase of the phase change material, a very large electric current is applied to the heater to generate heat to melt the phase change material at a temperature higher than the melting temperature of the phase change material; and the electric current is abruptly cut off to lower the temperature to below the crystallization temperature of the phase change material to quench and stabilize the amorphous structure of phase change material so as to achieve the high-resistance logical "0" state. The very large electric current can thus be in a pulse form.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 9(a), 9(b), 9(c), 9(d), 9(e), and 9(f) show sequential manufacturing operations for forming a PCRAM according to embodiments of the present disclosure.

FIGS. 10(a), 10(b),10(c),10(d),10(e),10(f),10(g),10(h), and 10(i) show sequential manufacturing operations for forming a PCRAM according to embodiments of the present disclosure.

FIGS. 11(a), 11(b), 11(c), 11(d), 11(e), 11(f), 11(g), and 11(h) show sequential manufacturing operations for forming a PCRAM according to embodiments of the present disclosure.

FIGS. 12(a), 12(b), 12(c), 12(d), 12(e), 12(f), and 12(g), show sequential manufacturing operations for forming a PCRAM according to embodiments of the present disclosure.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

Figure 1A:
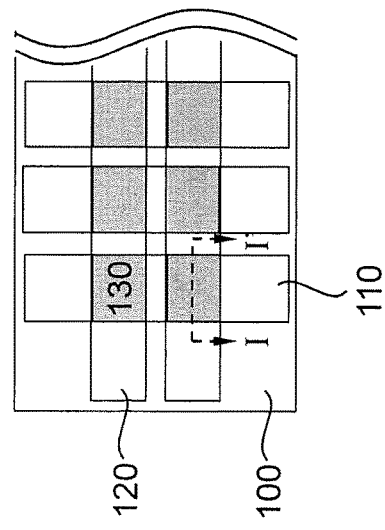
FIG. 1(a) shows a top view of a PCRAM according to an embodiment of the present disclosure.

FIG. 1(a) shows a top view of a PCRAM having a substrate 100, a bottom electrode 120 formed over the substrate 100 where the bottom electrode may be a bit line, a phase change material layer 130 formed over the bottom electrode 120, and a metal layer 110 formed over the phase change material 130. In this embodiment, the size of the phase change material layer 130 is the same as the overlapped area between the bottom electrode 120 and the metal layer 110 which functions as a top electrode.

In some embodiments, the substrate 100 comprises a single crystalline semiconductor material such as, but not limited to Si, Ge, SiGe, GaAs, InSb, GaP, GaSb, InAlAs, InGaAs, GaSbP, GaAsSb and InP. In certain embodiments, the substrate 100 is made of crystalline Si. In some embodiments, the metal layer 110 and the bottom electrode 120 are formed of the same material or different materials, including one or more layers of conductive material, such as polysilicon, aluminum, copper, titanium, tantalum, tungsten, cobalt, molybdenum, carbon, tantalum nitride, nickel silicide, cobalt silicide, TiN, WN, TiAl, TiAlN, TaCN, TaC, TaSiN, metal alloys such as aluminum copper alloy, other suitable materials, and/or combinations thereof. Each of the metal layer 110 and the bottom electrode 120 has a thickness in a range from about 20 to about 2,000 nm in some embodiments. In some embodiments, the substrate 100 is a semiconductor-on-insulator substrate fabricated using separation by implantation of oxygen (SIMOX), wafer bonding, and/or other suitable methods, such as a silicon-on-insulator (SOI) substrate, a silicon germanium-on-insulator (SGOI) substrate, or a germanium-on-insulator (GOI) substrate. In some embodiments, the substrate 100 includes transistors such as MOSFET planar transistors, FinFETs, and Gate All Around (GAA) transistors, metal lines such as poly-lines and interconnect metal lines, and the transistors control the operations of the PCRAM. In some embodiments, the bottom electrode 120 is a metal line connected with the transistors included by the substrate 100.

Figure 1B:
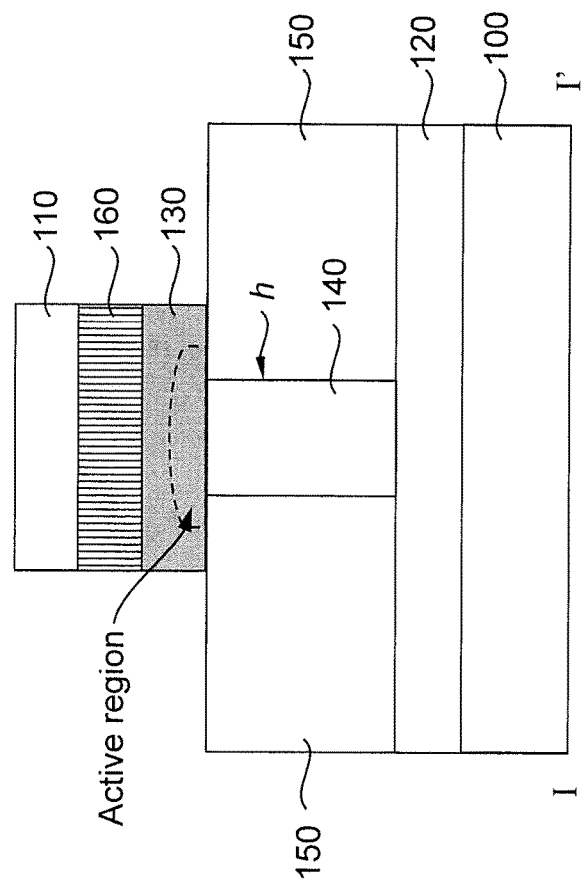
FIG. 1(b) shows a cross-sectional view of the PCRAM along a cut line I-I' of FIG. 1(a).

FIG. 1(b) shows a cross-sectional view of the PCRAM having insulating layer 150 which includes a through hole h. In the through hole h, a heater 140 is formed. In some embodiments, the heater 140 is formed of thin film material of TiN, TaN, or TiAlN that has a thickness in a range from about 5 to about 15 nm to provide Joule heating to the phase change material layer 130. Also, the heater 140 may function as a heat sink during quenching (during abrupt cutoff of the current applied to the heater 140 to 'freeze' the amorphous phase). The heater 140 fills the through hole h provided in the insulating layer 150 which prevents heat transfer between PCRAM cells so as to avoid thermal disturbance which may disable state retention or interrupt the read/write process.

In some embodiments, the insulating layer 150 is composed of, but not limited to, silicon oxide ($SiO_2$), silicon nitride ($Si_3N_4$), silicon oxynitride (SiON), SiOCN, SiCN, $Al_2O_3$, fluorine-doped silicate glass (FSG), a low-k dielectric material, or various other suitable dielectric materials used in manufacturing semiconductor devices. The insulating layer 150 disposed over the patterned bottom electrode 120 is an electrical and thermal insulator, and has a thickness in a range from about 5 to about 350 nm in some embodiments.

The phase change material layer 130 receives the heat generated by the heater 140, and a region (called "active region") close to the interface between the phase change material layer 130 and the heater 140 undergoes a phase transition from crystalline phase to amorphous phase or vice versa, depending on the amount and duration of heat generated when an electric current is applied to the heater 140. In the embodiment in FIG. 1(b), the active region has a mushroom-shape (FIG. 1(b)), while the region outside the active region does not undergo phase transition and may function as heat insulating layer to preserve the heat inside the mushroom-shaped active region. The smaller the active region, the less an amount of heat and thus less current is required for writing to the PCRAM cell. In some embodiments, the material of the phase change material layer 130 is a binary system of Ga—Sb, In—Sb, In—Se, Sb—Te, Ge—Te, and Ge—Sb; a ternary system, of Ge—Sb—Te, In—Sb—Te, Ga—Se—Te, Sn—Sb—Te, In—Sb—Ge, and Ga—Sb—Te; or a quaternary system of Ag—In—Sb—Te, Ge—Sn—Sb—Te, Ge—Sb—Se—Te, Te—Ge—Sb—S, Ge—Sb—Te—O, and Ge—Sb—Te—N. In some embodiments, the material for the phase change material layer 130 is a chalcogenide alloy containing one or more elements from Group VI of the periodic table, such as a GST, a Ge—Sb—Te alloy (e.g. $Ge_2Sb_2Te_5$) having a thickness of 5 to 100 nm. The phase change material layer 130 may include other phase change resistive materials, such as metal oxides including tungsten oxide, nickel oxide, copper oxide, etc. The phase transition between the crystalline phase and the amorphous phase of the phase change material is related to the interplay between the long range order and the short range order of the structure of the phase change material. For example, collapse of the long range order generates the amorphous phase. The long range order in the crystalline phase facilitates electrical conduction, while the amorphous phase impedes electrical conduction and results in high electrical resistance. To tune the properties of the phase change material layer 130 for different needs, the material of the phase change material layer 130 may be doped with various elements at different amounts to adjust the proportion of the short range order and the long range order inside the bonding structure of the material. The doped element may be any element used for semiconductor doping through the use of, for example, ion implantation.

A selector layer 160 is formed over the phase change material layer 130, and a metal layer 110 is formed over the selector layer 160. In a phase change memory array, for example, a cross-point array with hundreds or more memory cells, many problems disturbing the proper operation of a memory cell may occur. The problems may be electrical in nature, such as leakage current, parasitic capacitance, etc. The problems may also be thermal in nature, such as a thermal disturbance between memory cells. To solve the above problems, a switching device is used to reduce or avoid leakage current from an operating memory cell or from other memory cells passing along the resistive network. By using a switching device, the heaters of other memory cells would not be accidentally turned on by a leakage current, thereby wiping off the recorded states in the memory cells. A switching device functioning like a diode device or a transistor device is used so that only the intended PCRAM cells are selected for read/write while other PCRAM cells are not turned on, and to reduce or prevent leakage current originating from the selected PCRAM cells. To provide accurate read/write operations, a selector layer having high on-state conductivity and infinite off-state resistance is desired to be formed over the phase change material layer 130 to reduce the power dissipation in the resistive network of the PCRAM, leakage current and cross-talk disturbance, while making sure only the selected PCRAM cells are undergoing read/write operation. In this way, a reliable PCRAM can be formed. Considering the size of the switching device, a diode type (such as pn junction diode, Schottky diode, metal-insulator transition MIT, and ovonic threshold switch OTS) device may have a smaller size than a transistor type (such as a MOSFET, metal-oxide-semiconductor-field-effect-transistor) device. The selector layer 160 may function as a diode type device with a diode junction formed within the selector layer 160. In FIG. 1(b), the selector layer is formed over and patterned with the phase change material layer 130 formed of the aforementioned materials to have the same size, greatly reducing the space within the PCRAM for the selector device which is considered a limiting factor for the shrinking trend of memory devices. In some embodiments, the selector layer 160 provides a current-voltage non-linearity to the PCRAM, and this reduces leakage current. The selector layer 160 has a single-layer or multi-layered structure, in some embodiments. In some embodiments, the selector layer 160 is made of a material including $SiO_x$, $TiO_x$, $AlO_x$, $WO_x$, $Ti_xN_yO_z$, $HfO_x$, $TaO_x$, $NbO_x$, or the like, or suitable combinations thereof, where x, y and z are non-stoichiometric values. In some embodiments, the selector layer 160 is a solid-electrolyte material containing one or more of Ge, Sb, S, Te or a chalcogenide such as N, P, S, Si, and/or Te doped chalcogenide such as N, P, S, Si, and/or Te doped AsGeSe, i.e. AsGeSe(N, P, S, Si, Te), and N, P, S, Si, and/or Te doped AsGeSeSi, i.e. AsGeSeSi(N, P, S, Si, Te). The thickness of the selector layer 160 is in a range from about 0.5 nm to about 50 nm. In some embodiments, the selector layer 160 is formed by chemical vapor deposition (CVD), pulsed laser deposition (PLD), sputtering, atomic layer deposition (ALD) or any other thin film deposition method.

Figure 2A:
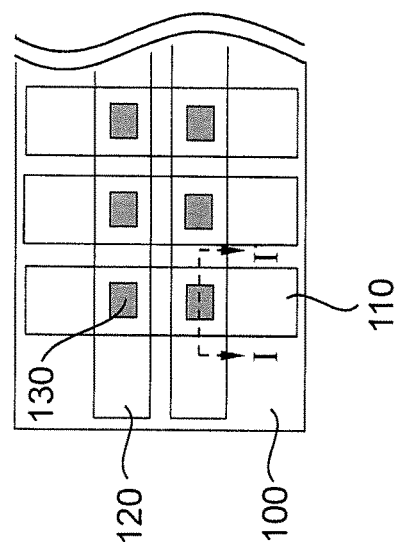
FIG. 2(a) shows a top view of a PCRAM according to another embodiment of the present disclosure.

FIG. 2(a) shows a top view of a PCRAM according to another embodiment of the present disclosure. The PCRAM has a substrate 100, a bottom electrode 120 formed over the substrate 100 where the bottom electrode may be a bit line, a phase change material layer 130 formed over the bottom electrode 120, and a metal layer 110 formed over the phase change material 130. In this embodiment, the size of the phase change material layer 130 is smaller than the overlapped area between the bottom electrode 120 and the metal layer 110 which functions as a top electrode. That is, the size of the phase change material layer 130 in the embodiment of FIG. 2(a) is smaller than the size of the phase change material layer 130 in the embodiment of FIG. 1(a). The smaller phase change material layer 130 provides a benefit of reduced operating electric current required to be supplied to the heater to heat the phase change material layer 130 for writing, and thus significantly reducing the overall power consumption of a memory having over a thousand phase change material layers 130.

In some embodiments, the substrate 100 comprises a single crystalline semiconductor material such as, but not limited to Si, Ge, SiGe, GaAs, InSb, GaP, GaSb, InAlAs, InGaAs, GaSbP, GaAsSb and InP. In certain embodiments, the substrate 100 is made of crystalline Si. In some embodiments, the metal layer 110 and the bottom electrode 120 are formed of the same material or different materials, including one or more layers of conductive material, such as polysilicon, aluminum, copper, titanium, tantalum, tungsten, cobalt, molybdenum, carbon, tantalum nitride, nickel silicide, cobalt silicide, TiN, WN, TiAl, TiAlN, TaCN, TaC, TaSiN, metal alloys such as aluminum copper alloy, other suitable materials, and/or combinations thereof. Each of the metal layer 110 and the bottom electrode 120 has a thickness in a range from about 20 to about 2,000 nm in some embodiments. In some embodiments, the substrate 100 is a semiconductor-on-insulator substrate fabricated using separation by implantation of oxygen (SIMOX), wafer bonding, and/or other suitable methods, such as a silicon-on-insulator (SOI) substrate, a silicon germanium-on-insulator (SGOI) substrate, or a germanium-on-insulator (GOI) substrate. In some embodiments, the substrate 100 includes transistors such as MOSFET planar transistors, FinFETs, and Gate All Around (GAA) transistors, metal lines such as poly-lines and interconnect metal lines, and the transistors control the operations of the PCRAM. In some embodiments, the bottom electrode 120 is a metal line connected with the transistors included by the substrate 100.

Figure 2B:
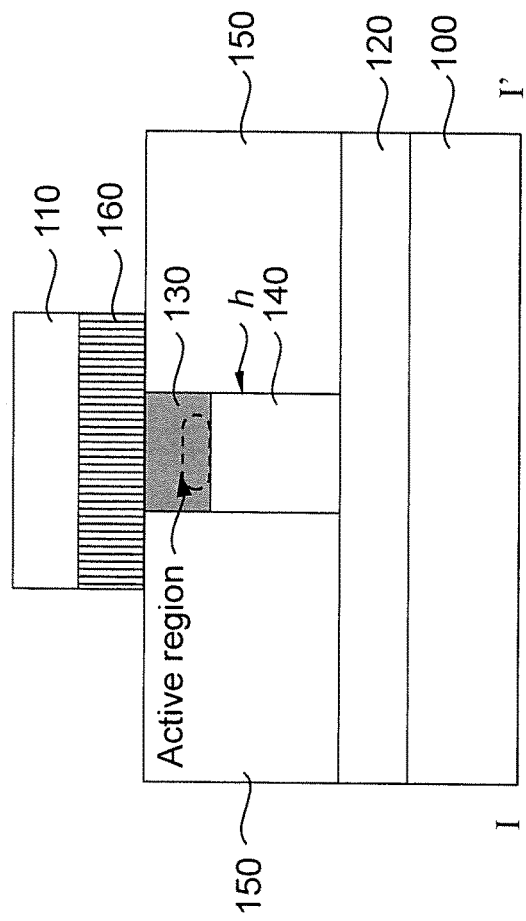
FIG. 2(b) shows a cross-sectional view of the PCRAM along a cut line I-I' of FIG. 2(a).

FIG. 2(b) shows a cross-sectional view of the PCRAM according to the embodiment shown in FIG. 2(a). The PCRAM has an insulating layer 150 which includes a through hole h. In the through hole h, a heater 140 is formed. In some embodiments, the heater 140 is formed of thin film material of TiN, TaN, or TiAlN that has a thickness in a range from about 5 to about 15 nm to provide Joule heating to the phase change material layer 130. Also, the heater 140 may function as a heat sink during quenching (during abrupt cutoff of the current applied to the heater 140 to 'freeze' the amorphous phase). The heater 140 fills the through hole h provided in the insulating layer 150 which prevents heat transfer between PCRAM cells so as to avoid thermal disturbance which may disable state retention or interrupt the read/write process. The phase change material layer 130 is formed in the through hole h and may contact the heater 140. In this way, the active region in the phase change material layer 130 undergoing phase transition during writing of the memory cell is different from that in FIG. 1(b) which has a mushroom shape. A selector layer 160 is formed over the phase change material layer 130 and has a size (width of about 25 nm to about 100 nm) greater than the phase change material layer 130 in the through hole having a width of about 10 nm. A metal layer 110 is formed over the selector layer 160 and functions as a top electrode for the read/write operation of the PCRAM cell.

In some embodiments, the insulating layer 150 is composed of, but not limited to, silicon oxide ($SiO_2$), silicon nitride ($Si_3N_4$), silicon oxynitride (SiON), SiOCN, SiCN, $Al_2O_3$, fluorine-doped silicate glass (FSG), a low-k dielectric material, or various other suitable dielectric materials used in manufacturing semiconductor devices. The insulating layer 150 disposed over the patterned bottom electrode 120 is an electrical and thermal insulator, and has a thickness in a range from about 5 to about 350 nm in some embodiments.

The phase change material layer 130 receives the heat generated by the heater 140, and a region (called "active region") close to the interface between the phase change material layer 130 and the heater 140 undergoes a phase transition from crystalline phase to amorphous phase or vice versa, depending on the amount and duration of heat generated when an electric current is applied to the heater 140. In the embodiment in FIG. 2(b), the active region has an oval shape (FIG. 2(b)), while the region outside the active region does not undergo phase transition and may function as heat insulating layer to preserve the heat inside the active region. The smaller the active region, the less an amount of heat and thus less current is required for writing to the PCRAM cell. In some embodiments, the material of the phase change material layer 130 is a binary system of Ga—Sb, In—Sb, In—Se, Sb—Te, Ge—Te, and Ge—Sb; a ternary system, of Ge—Sb—Te, In—Sb—Te, Ga—Se—Te, Sn—Sb—Te, In—Sb—Ge, and Ga—Sb—Te; or a quaternary system of Ag—In—Sb—Te, Ge—Sn—Sb—Te, Ge—Sb—Se—Te, Te—Ge—Sb—S, Ge—Sb—Te—O, and Ge—Sb—Te—N. In some embodiments, the material for the phase change material layer 130 is a chalcogenide alloy containing one or more elements from Group VI of the periodic table, such as a GST, a Ge—Sb—Te alloy (e.g. $Ge_2Sb_2Te_5$) having a thickness of 5 to 100 nm. The phase change material layer 130 may include other phase change resistive materials, such as metal oxides including tungsten oxide, nickel oxide, copper oxide, etc.

A selector layer 160 is formed over the phase change material layer 130, and a metal layer 110 is formed over the selector layer 160. In FIG. 2(b), the selector layer 160 is formed over the phase change material layer 130 formed of the aforementioned materials to have a greater size than the phase change material layer 130, greatly enhancing the controllability and selectability of the phase changer material layer 130. In some embodiments, the selector layer 160 provides a current-voltage non-linearity to the PCRAM, and this reduces leakage current. The selector layer 160 has the above structures. In some embodiments, the selector layer 160 is made of the above mentioned materials in the above description of FIG. 1(b). The thickness of the selector layer 160 is in a range from about 0.5 nm to about 50 nm. In some embodiments, the selector layer 160 is formed by chemical vapor deposition (CVD), pulsed laser deposition (PLD), sputtering, atomic layer deposition (ALD) or any other thin film deposition method.

Figure 3A:
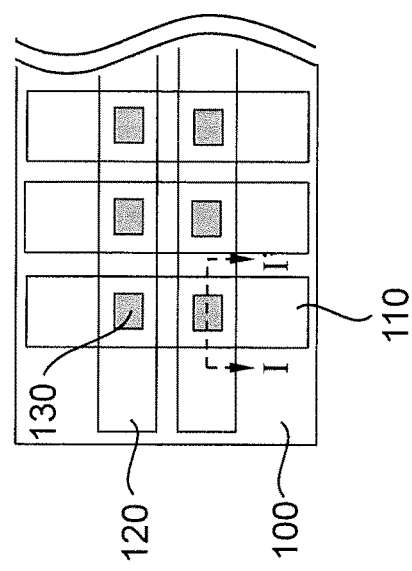
FIG. 3(a) shows a top view of a PCRAM according to another embodiment of the present disclosure.

FIG. 3(a) shows a top view of a PCRAM according to another embodiment of the present disclosure. The PCRAM has a substrate 100, a bottom electrode 120 formed over the substrate 100 where the bottom electrode may be a bit line, a phase change material layer 130 formed over the bottom electrode 120, and a metal layer 110 formed over the phase change material 130. In this embodiment, the size of the phase change material layer 130 is smaller than the overlapped area between the bottom electrode 120 and the metal layer 110 which functions as a top electrode. That is, the size of the phase change material layer 130 in the embodiment of FIG. 3(a) is smaller than the size of the phase change material layer 130 in the embodiment of FIG. 1(a). The smaller phase change material layer 130 provides a benefit of reduced operating electric current required to be supplied to the heater to heat the phase change material layer 130 for writing, and thus significantly reducing the overall power consumption of a memory having over a thousand phase change material layers 130.

In some embodiments, the substrate 100 comprises a single crystalline semiconductor material such as, but not limited to Si, Ge, SiGe, GaAs, InSb, GaP, GaSb, InAlAs, InGaAs, GaSbP, GaAsSb and InP. In certain embodiments, the substrate 100 is made of crystalline Si. In some embodiments, the metal layer 110 and the bottom electrode 120 are formed of the same material or different materials, including one or more layers of conductive material, such as polysilicon, aluminum, copper, titanium, tantalum, tungsten, cobalt, molybdenum, carbon, tantalum nitride, nickel silicide, cobalt silicide, TiN, WN, TiAl, TiAlN, TaCN, TaC, TaSiN, metal alloys such as aluminum copper alloy, other suitable materials, and/or combinations thereof. Each of the metal layer 110 and the bottom electrode 120 has a thickness in a range from about 20 to about 2,000 nm in some embodiments. In some embodiments, the substrate 100 is a semiconductor-on-insulator substrate fabricated using separation by implantation of oxygen (SIMOX), wafer bonding, and/or other suitable methods, such as a silicon-on-insulator (SOI) substrate, a silicon germanium-on-insulator (SGOI) substrate, or a germanium-on-insulator (GOI) substrate. In some embodiments, the substrate 100 includes transistors such as MOSFET planar transistors, FinFETs, and Gate All Around (GAA) transistors, metal lines such as poly-lines and interconnect metal lines, and the transistors control the operations of the PCRAM. In some embodiments, the bottom electrode 120 is a metal line connected with the transistors included by the substrate 100.

Although the top view is the same as that shown in FIG. 2(a), the device structure is different from FIG. 2(b). The PCRAM has an insulating layer 150 which includes a through hole h. In the through hole h, a heater 140 is formed. In some embodiments, the heater 140 is formed of thin film material of TiN, TaN, or TiAlN that has a thickness in a range from about 5 to about 15 nm to provide Joule heating to the phase change material layer 130. Also, the heater 140 may function as a heat sink during quenching (during abrupt cutoff of the current applied to the heater 140 to 'freeze' the amorphous phase). The heater 140 fills the through hole h provided in the insulating layer 150 which prevents heat transfer between PCRAM cells so as to avoid thermal disturbance which may disable state retention or interrupt the read/write process.

Figure 3B:
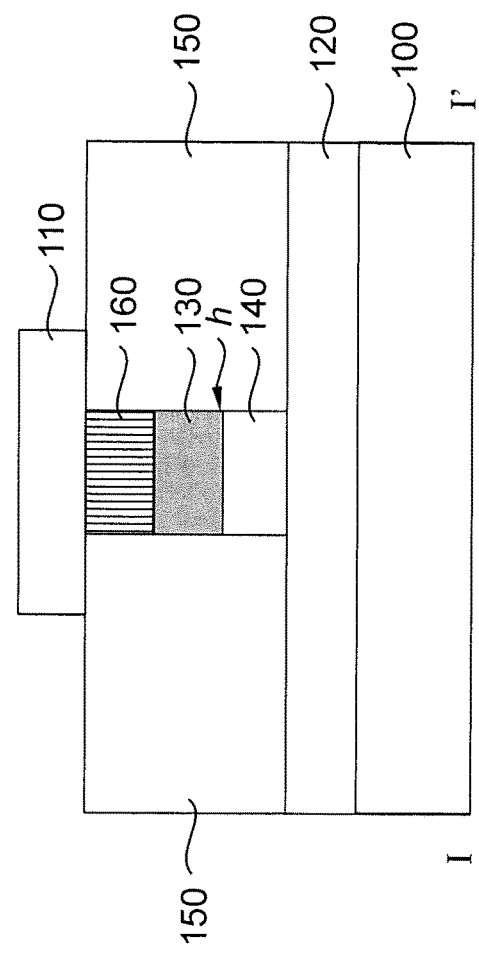
FIG. 3(b) shows a cross-sectional view of the PCRAM along a cut line I-I' of FIG. 3(a).

Also, as shown in the cross-sectional view in FIG. 3(b), the selector layer 160 is formed in the through hole h, greatly reducing the space occupied by the selector device in the PCRAM cell. A metal layer 110 is formed over the selector layer 160 and functions as a top electrode for the read/write operation of the PCRAM cell.

In some embodiments, the insulating layer 150 is composed of, but not limited to, silicon oxide ($SiO_2$), silicon nitride ($Si_3N_4$), silicon oxynitride (SiON), SiOCN, SiCN, $Al_2O_3$, fluorine-doped silicate glass (FSG), a low-k dielectric material, or various other suitable dielectric materials used in manufacturing semiconductor devices. The insulating layer 150 disposed over the patterned bottom electrode 120 is an electrical and thermal insulator, and has a thickness in a range from about 5 to about 350 nm in some embodiments.

The phase change material layer 130 receives the heat generated by the heater 140, and a region (called "active region") close to the interface between the phase change material layer 130 and the heater 140 undergoes a phase transition from crystalline phase to amorphous phase or vice versa, depending on the amount and duration of heat generated when an electric current is applied to the heater 140. In the embodiment in FIG. 1(b), the active region has a mushroom-shape (FIG. 1(b)), while the region outside the active region does not undergo phase transition and may function as heat insulating layer to preserve the heat inside the mushroom-shaped active region. The smaller the active region, the less an amount of heat and thus less current is required for writing to the PCRAM cell. In some embodiments, the material of the phase change material layer 130 is a binary system of Ga—Sb, In—Sb, In—Se, Sb—Te, Ge—Te, and Ge—Sb; a ternary system, of Ge—Sb—Te, In—Sb—Te, Ga—Se—Te, Sn—Sb—Te, In—Sb—Ge, and Ga—Sb—Te; or a quaternary system of Ag—In—Sb—Te, Ge—Sn—Sb—Te, Ge—Sb—Se—Te, Te—Ge—Sb—S, Ge—Sb—Te—O, and Ge—Sb—Te—N. In some embodiments, the material for the phase change material layer 130 is a chalcogenide alloy containing one or more elements from Group VI of the periodic table, such as a GST, a Ge—Sb—Te alloy (e.g. $Ge_2Sb_2Te_5$) having a thickness of 5 to 100 nm. The phase change material layer 130 may include other phase change resistive materials, such as metal oxides including tungsten oxide, nickel oxide, copper oxide, etc.

A selector layer 160 is formed over the phase change material layer 130, and a metal layer 110 is formed over the selector layer 160. In FIG. 3(b), the selector layer is formed over and patterned with the phase change material layer 130 formed of the aforementioned materials to have the same size, greatly reducing the space within the PCRAM for the selector device which is considered a limiting factor for the shrinking trend of memory devices. In some embodiments, the selector layer 160 provides a current-voltage non-linearity to the PCRAM, and this reduces leakage current. The selector layer 160 has the above structures. In some embodiments, the selector layer 160 is made of the above mentioned materials in the above description of FIG. 1(b). The thickness of the selector layer 160 is in a range from about 0.5 nm to about 50 nm. In some embodiments, the selector layer 160 is formed by chemical vapor deposition (CVD), pulsed laser deposition (PLD), sputtering, atomic layer deposition (ALD) or any other thin film deposition method.

Figure 4A:
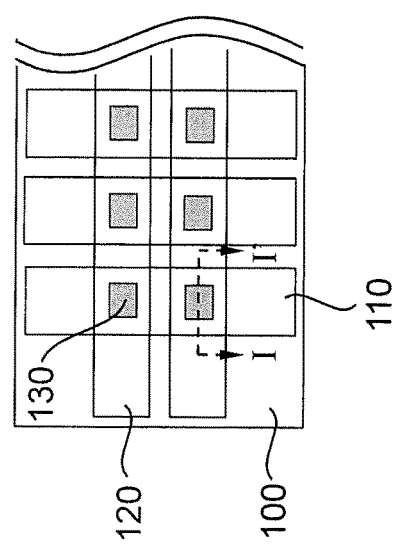
FIG. 4(a) shows a top view of a PCRAM according to another embodiment of the present disclosure.

FIG. 4(a) shows a top view of a PCRAM according to another embodiment of the present disclosure. The PCRAM has a substrate 100, a bottom electrode 120 formed over the substrate 100 where the bottom electrode may be a bit line, a phase change material layer 130 formed over the bottom electrode 120, and a metal layer 110 formed over the phase change material 130. In this embodiment, the size of the phase change material layer 130 is smaller than the overlapped area between the bottom electrode 120 and the metal layer 110 which functions as a top electrode. That is, the size of the phase change material layer 130 in the embodiment of FIG. 3(a) is smaller than the size of the phase change material layer 130 in the embodiment of FIG. 1(a). The smaller phase change material layer 130 provides a benefit of reduced operating electric current required to be supplied to the heater to heat the phase change material layer 130 for writing, and thus significantly reducing the overall power consumption of a memory having over a thousand phase change material layers 130.

In some embodiments, the substrate 100 comprises a single crystalline semiconductor material such as, but not limited to, Si, Ge, SiGe, GaAs, InSb, GaP, GaSb, InAlAs, InGaAs, GaSbP, GaAsSb and InP. In certain embodiments, the substrate 100 is made of crystalline Si. In some embodiments, the metal layer 110 and the bottom electrode 120 are formed of the same material or different materials, including one or more layers of conductive material, such as polysilicon, aluminum, copper, titanium, tantalum, tungsten, cobalt, molybdenum, carbon, tantalum nitride, nickel silicide, cobalt silicide, TiN, WN, TiAl, TiAlN, TaCN, TaC, TaSiN, metal alloys such as aluminum copper alloy, other suitable materials, and/or combinations thereof. Each of the metal layer 110 and the bottom electrode 120 has a thickness in a range from about 20 to about 2,000 nm in some embodiments. In some embodiments, the substrate 100 is a semiconductor-on-insulator substrate fabricated using separation by implantation of oxygen (SIMOX), wafer bonding, and/or other suitable methods, such as a silicon-on-insulator (SOI) substrate, a silicon germanium-on-insulator (SGOI) substrate, or a germanium-on-insulator (GOI) substrate. In some embodiments, the substrate 100 includes transistors such as MOSFET planar transistors, FinFETs, and Gate All Around (GAA) transistors, metal lines such as poly-lines and interconnect metal lines, and the transistors control the operations of the PCRAM. In some embodiments, the bottom electrode 120 is a metal line connected with the transistors included by the substrate 100.

Although the top view is the same as that shown in FIGS. 2(a) and 3(a), the device structure is different from FIGS. 2(b) and 3(b). The PCRAM has an insulating layer 150 which includes a through hole h. In the through hole h, a heater 140 is formed. In some embodiments, the heater 140 is formed of thin film material of TiN, TaN, or TiAlN that has a thickness in a range from about 5 to about 15 nm to provide Joule heating to the phase change material layer 130. Also, the heater 140 may function as a heat sink during quenching (during abrupt cutoff of the current applied to the heater 140 to 'freeze' the amorphous phase). The heater 140 fills the through hole h provided in the insulating layer 150 which prevents heat transfer between PCRAM cells so as to avoid thermal disturbance which may disable state retention or interrupt the read/write process.

Figure 4B:
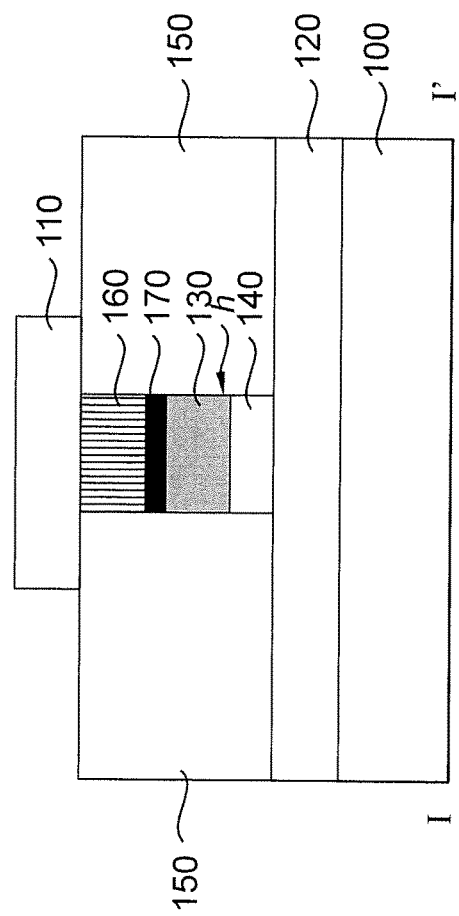
FIG. 4(b) shows a cross-sectional view of the PCRAM along a cut line I-I' of FIG. 4(a).

As shown in the cross-sectional view in FIG. 4(b), an intermediate layer 170 is further formed in the through hole h and is formed between the selector layer 160 and the phase change material layer 130. The intermediate layer 170 may be formed of carbon, titanium, titanium nitride, tungsten, and titanium-tungsten with a thickness of about 1 to 50 nm and functions to prevent material diffusion into and contamination of the phase change material layer 130. In some embodiments, the intermediate layer 170 is formed by any vapor deposition method such as chemical vapor deposition (CVD), pulsed laser deposition (PLD), sputtering, atomic layer deposition (ALD) or any other thin film deposition method. In some embodiments, the intermediate layer 170 reduces the incorporation of species form the metal layer 110 into the phase change material layer 130.

In some embodiments, the insulating layer 150 is composed of, but not limited to, silicon oxide ($SiO_2$), silicon nitride ($Si_3N_4$), silicon oxynitride (SiON), SiOCN, SiCN, $Al_2O_3$, fluorine-doped silicate glass (FSG), a low-k dielectric material, or various other suitable dielectric materials used in manufacturing semiconductor devices. The insulating layer 150 disposed over the patterned bottom electrode 120 is an electrical and thermal insulator, and has a thickness in a range from about 5 to about 350 nm in some embodiments.

The phase change material layer 130 receives the heat generated by the heater 140, and a region (called "active region") close to the interface between the phase change material layer 130 and the heater 140 undergoes a phase transition from crystalline phase to amorphous phase or vice versa, depending on the amount and duration of heat generated when an electric current is applied to the heater 140. In the embodiment in FIG. 1(b), the active region has a mushroom-shape (FIG. 1(b)), while the region outside the active region does not undergo phase transition and may function as heat insulating layer to preserve the heat inside the mushroom-shaped active region. The smaller the active region, the less an amount of heat and thus less current is required for writing to the PCRAM cell. In some embodiments, the material of the phase change material layer 130 is a binary system of Ga—Sb, In—Sb, In—Se, Sb—Te, Ge—Te, and Ge—Sb; a ternary system, of Ge—Sb—Te, In—Sb—Te, Ga—Se—Te, Sn—Sb—Te, In—Sb—Ge, and Ga—Sb—Te; or a quaternary system of Ag—In—Sb—Te, Ge—Sn—Sb—Te, Ge—Sb—Se—Te, Te—Ge—Sb—S, Ge—Sb—Te—O, and Ge—Sb—Te—N. In some embodiments, the material for the phase change material layer 130 is a chalcogenide alloy containing one or more elements from Group VI of the periodic table, such as a GST, a Ge—Sb—Te alloy (e.g. $Ge_2Sb_2Te_5$) having a thickness of 5 to 100 nm. The phase change material layer 130 may include other phase change resistive materials, such as metal oxides including tungsten oxide, nickel oxide, copper oxide, etc.

A selector layer 160 is formed over the phase change material layer 130, and a metal layer 110 is formed over the selector layer 160. In FIG. 4(b), the selector layer is formed over and patterned with the phase change material layer 130 formed of the aforementioned materials to have the same size (width), greatly reducing the space within the PCRAM for the selector device which is considered a limiting factor for the shrinking trend of memory devices. In some embodiments, the selector layer 160 provides a current-voltage non-linearity to the PCRAM, and this reduces leakage current. The selector layer 160 has the above structures. In some embodiments, the selector layer 160 is made of the above mentioned materials in the above description of FIG. 1(b). The thickness of the selector layer 160 is in a range from about 0.5 nm to about 50 nm. In some embodiments, the selector layer 160 is formed by chemical vapor deposition (CVD), pulsed laser deposition (PLD), sputtering, atomic layer deposition (ALD) or any other thin film deposition method.

A stacked PCRAM structure greatly increases the memory cell density and capacity in some embodiments. FIGS. 5, 6(a) to 6(b), 7(a) to 7(d), and 8(a) to 8(d) show various embodiments having stacked 3D structures.

Figure 5:
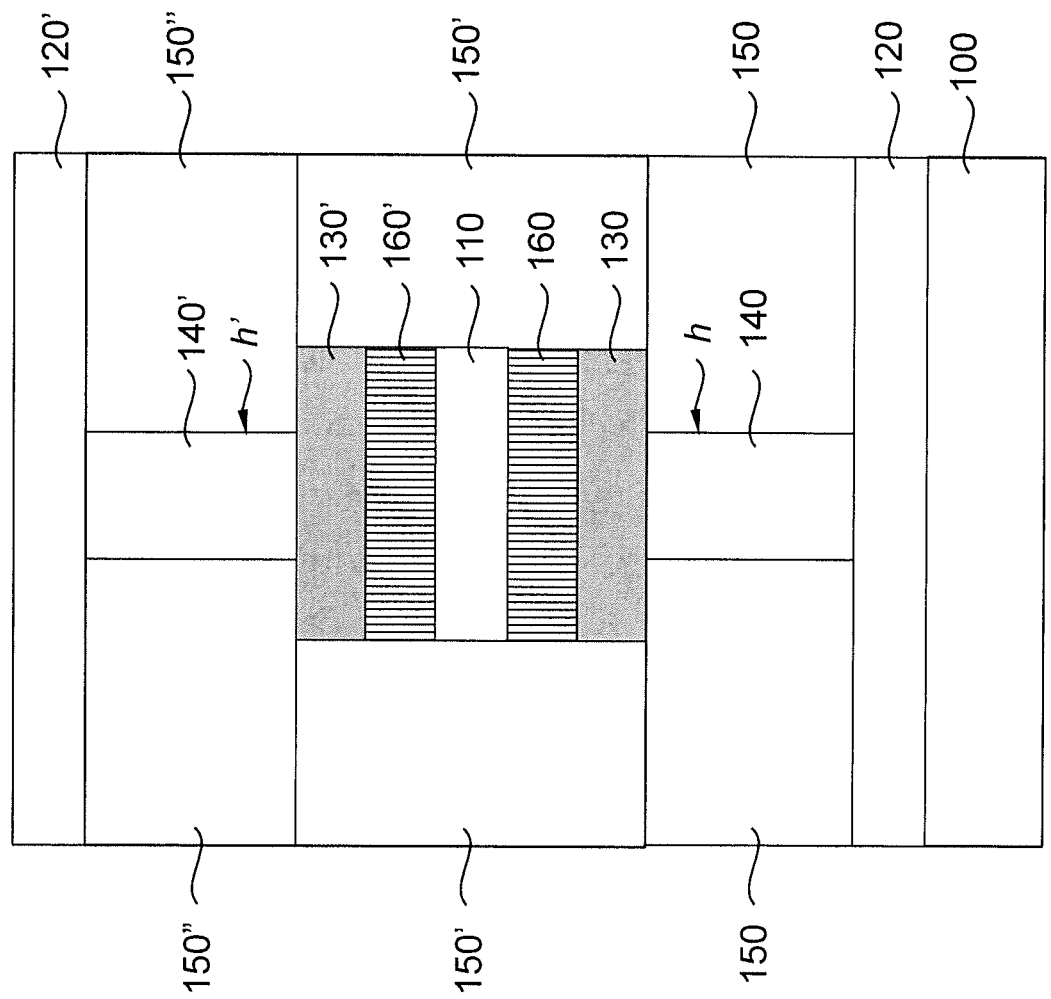
FIG. 5 shows a cross-sectional view of a PCRAM according to another embodiment of the present disclosure.

FIG. 5 shows a cross-sectional view of a stacked structure of a PCRAM including a bottom electrode 120 and top electrode 120'. Between the bottom electrode 120 and the top electrode 120', insulating layers 150, 150' and 150" are disposed. In some embodiments, the insulating layers 150, 150' and 150" are formed of the same materials described above with regard to FIGS. 1(b), 2(b), 3(b), and 4(b). The insulating layers 150, 150', and 150" disposed over the patterned bottom electrode 120 are electrical and thermal insulators, and each has a thickness in a range from about 5 to about 350 nm in some embodiments. Also, in some embodiments, the insulating layers 150' and 150" are formed as one layer by a single operation. The insulating layers 150, 150' and 150", with the top and bottom electrodes 120' and 120, enclose a first heater 140 and a second heater 140', a first phase change material layer 130 and a second phase change material layer 130', a first selector layer 160 and a second selector layer 160', and a metal layer 110. The first and second heaters 140 and 140' are formed in a first through hole h and a second through hole h', respectively, while the other components occupy a greater space provided in the insulating layer 150'. Each of the through holes h and h' is formed between the first or second phase change material layer 130 or 130' and the top or bottom electrode 120 or 120'.

The embodiment shown in FIG. 5 has a symmetrical structure with the device components arranged with respect to the metal layer 110. Each of the first and second phase change material layers 130 and 130' can be operated independently, and in this device structure, instead of four electrodes, only three electrodes, e.g. the bottom electrode 120, the top electrode 120' and the metal layer 110, are required to operate the two phase change material layers 130 and 130'. In this way, an electrode is eliminated and the device thickness is reduced, and the device structure and processing are simplified with reduced manufacturing cost and simplified manufacturing operations. Also, since the entire device is enclosed by the insulating layers 150, 150', and 150", the thermal disturbance and electrical disturbance, such as leakage current, are beneficially reduced. Also, because of the higher thermal insulation property, the electric current for writing the memory cell is reduced in some embodiments as the temperature of phase transition within this highly insulating system can be achieved by a lower electric current. Depending on the choice of heater material of the heaters 140 and 140', the efficiency of the entire stacked device can be greatly increased in some embodiments.

The embodiment in FIG. 5 stacks two of the devices of the embodiment of FIG. 1(b) along a vertical direction to form a stacked device; however, other possibilities are included in this disclosure, as would be appreciated by one of ordinary skill in the art. For example, in some embodiments, the lower half of the device is formed by the structure of the embodiment in FIG. 1(a) and the upper half of the device is, for example, formed by the structure of the embodiment in FIG. 2(b), forming a non-symmetrical 3D structure of a PCRAM.

Figure 6A:
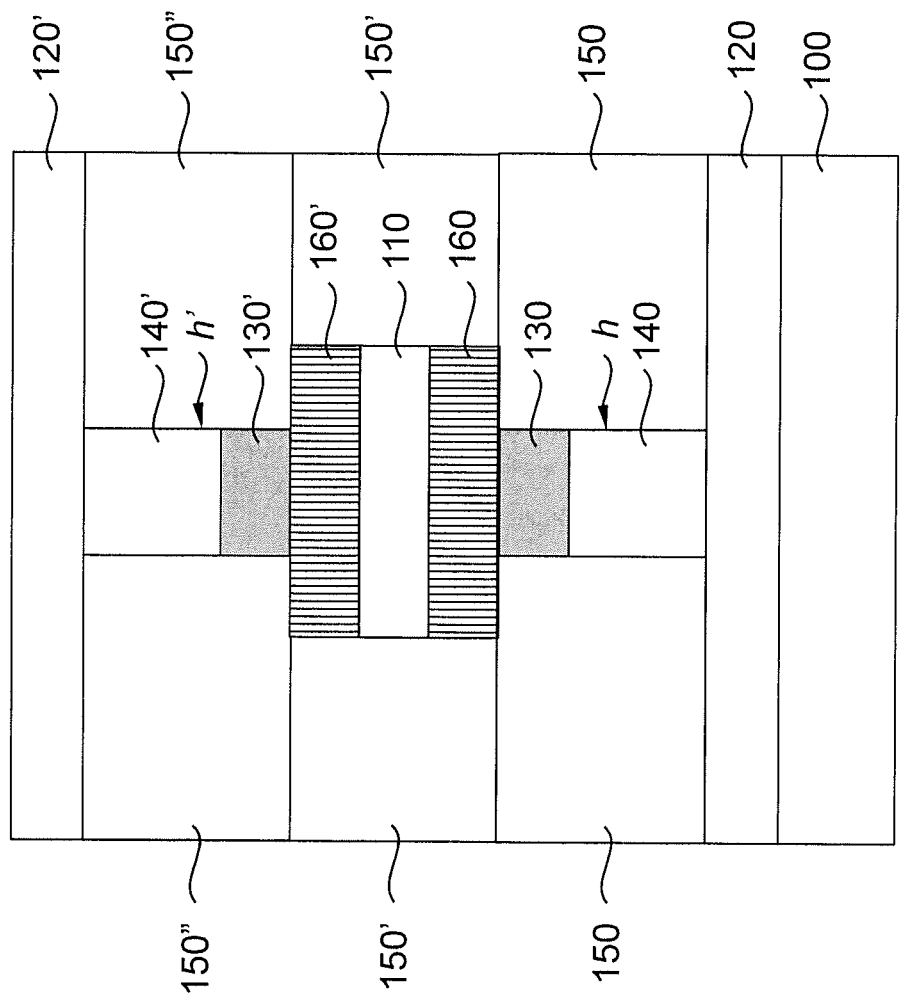
FIG. 6(a) shows a cross-sectional view of a PCRAM according to another embodiment of the present disclosure.

FIG. 6(a) shows a stacked device having a stacked structure symmetrical with respect to the metal layer 110. The stacked device includes phase change material layers 130 and 130' on opposing sides of the metal layer 110 formed in the through holes h and h' that contact the heaters 140 and 140' in some embodiments. In this way, the active regions undergoing phase transition during writing of the memory cell is different from that in FIG. 5 which has a mushroom shape. The smaller phase change material layers 130 and 130' significantly lower the operating electric current and reduce the overall power consumption of a memory having over a thousand phase change material layers in some embodiments. First selector layer 160 and second selector layer 160' are formed over the respective first phase change material layer 130 and second phase change material layer 130'. The first selector layer 160 and second selector layer 160' are larger than the respective first and second phase change material layers 130 and 130'. The selector layer 160' is formed of the same material as the selector layer 160, in some embodiments. In some embodiments, the selector layer 160' is formed of a material in the above group of materials used to make the selector layer 160, which is different from the selector layer 160. In some embodiments, the selector layer 160' has the same layered-structure as the selector layer 160. In some embodiments, the selector layer 160' has a different layered-structure than the selector layer 160, for example, but not limited to, the selector layer 160' has a single-layer structure while the selector layer 160 has a multi-layered structure.

Figure 6B:
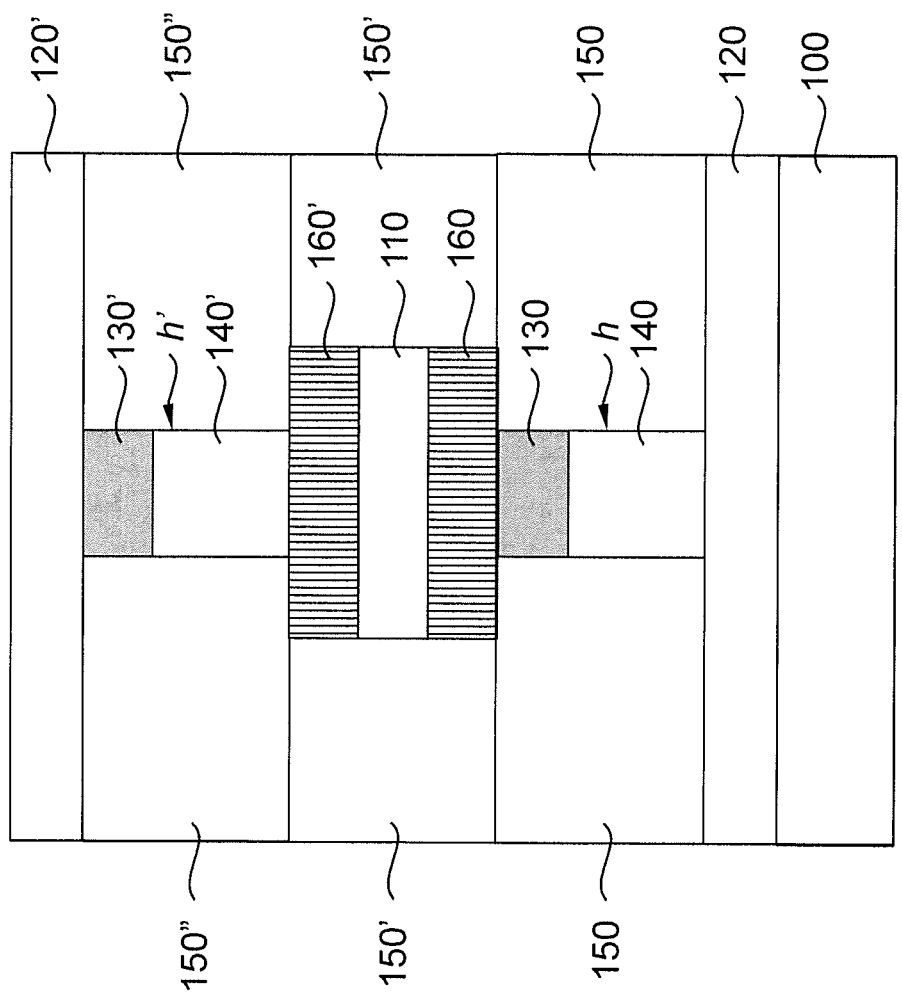
FIG. 6(b) shows a cross-sectional view of an alternative embodiment of the PCRAM of FIG. 6(a).

FIG. 6(b) shows an alternative embodiment of the embodiment shown in FIG. 6(a). FIG. 6(b) shows a non-symmetrical structure with respect to the metal layer 110, while FIG. 6(a) shows a symmetrical structure. In FIG. 6(b), the second phase change material layer 130' is formed over the second heater 140', spaced apart from the second selector layer 160'. In this embodiment, the second phase change material layer 130' receives heat generated from the top surface of the second heater 140'. If the heat transfer favors an upward direction, the arrangement of the second phase change material layer 130' over the second heater 140' may enhance the entire efficiency of the device. In this way, depending on the heat transfer direction within the memory device, the arrangement of the phase change material layers with respect to the heaters can be tailored to suit different needs with optimal efficiencies.

Figure 7A:
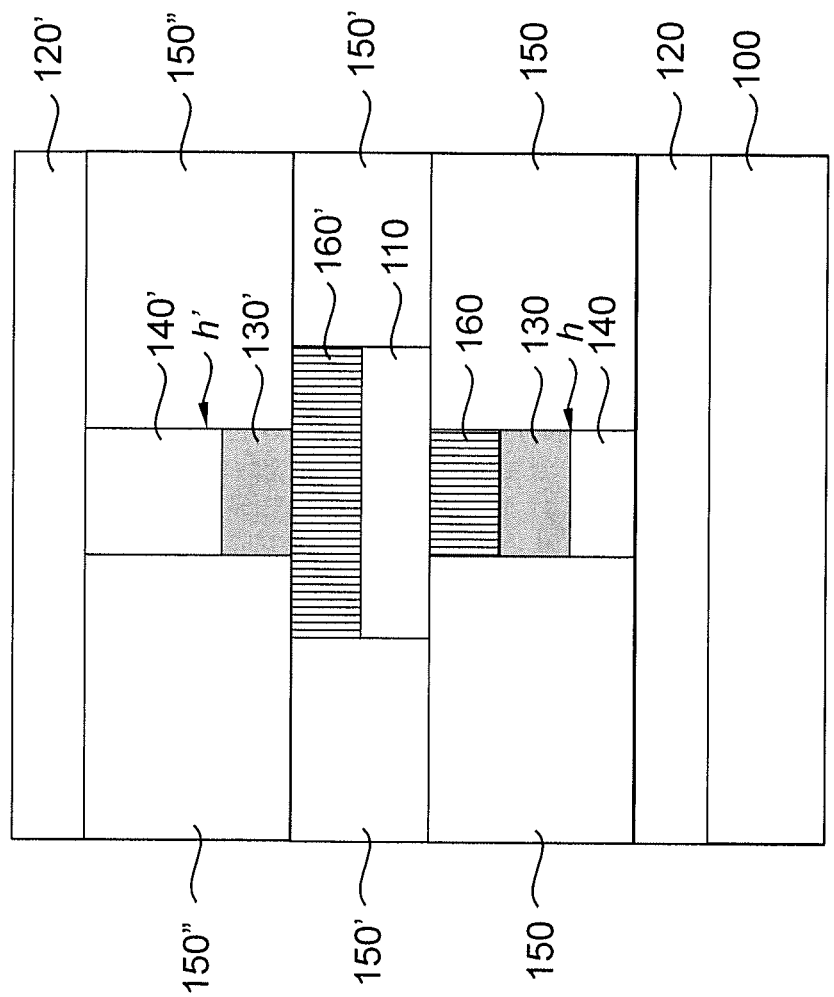
FIG. 7(a) shows a cross-sectional view of a PCRAM according to another embodiment of the present disclosure.

FIG. 7(a) shows an embodiment having a non-symmetrical structure with respect to the metal layer 110. Below the metal layer 110, the first selector layer 160 is entirely formed in the through hole h, and is formed over the first phase change material layer 130. The metal layer 110 is formed over the selector layer 160. Above the metal layer 110, a second selector layer 160' is formed over the metal layer 110, and the second selector layer 160' has a greater size (width) than the first selector layer 160. A second phase change material layer 130' is formed over the second selector layer 160' in the second through hole h'. A second heater 140' is formed over the second phase change material layer 130' in the second through hole h'. The embodiment of FIG. 7(a) is different from that in FIG. 6(b) because the two selector layers 160 and 160' inside this device in FIG. 7(a) have different dimensions (width). Also, the selector layers 160 and 160' are formed of different materials in some embodiments.

Figure 7B:
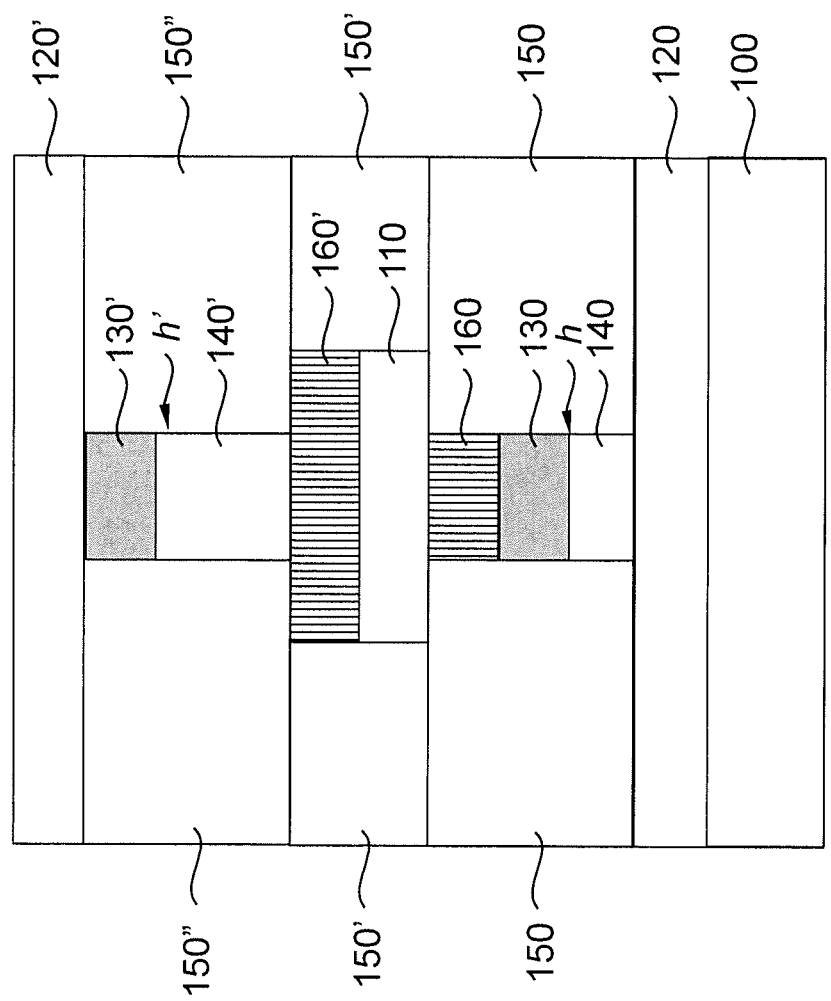
FIG. 7(b) shows a cross-sectional view of an alternative embodiment of the PCRAM of FIG. 7(a).

FIG. 7(b) shows an alternative embodiment of the embodiment shown in FIG. 7(a). In FIG. 7(b), the second phase change material 130' is formed over the second heater 140', spaced apart from the second selector layer 160'. In this embodiment, the second phase change material layer 130' receives heat generated from the top surface of the second heater 140'. If the heat transfer favors an upward direction, the arrangement of the second phase change material layer 130' over the second heater 140' may enhance the entire efficiency of the device. In this way, depending on the heat transfer direction within the memory device, the arrangement of the phase change material layers with respect to the heaters can be tailored to suit different needs.

Figure 8A:
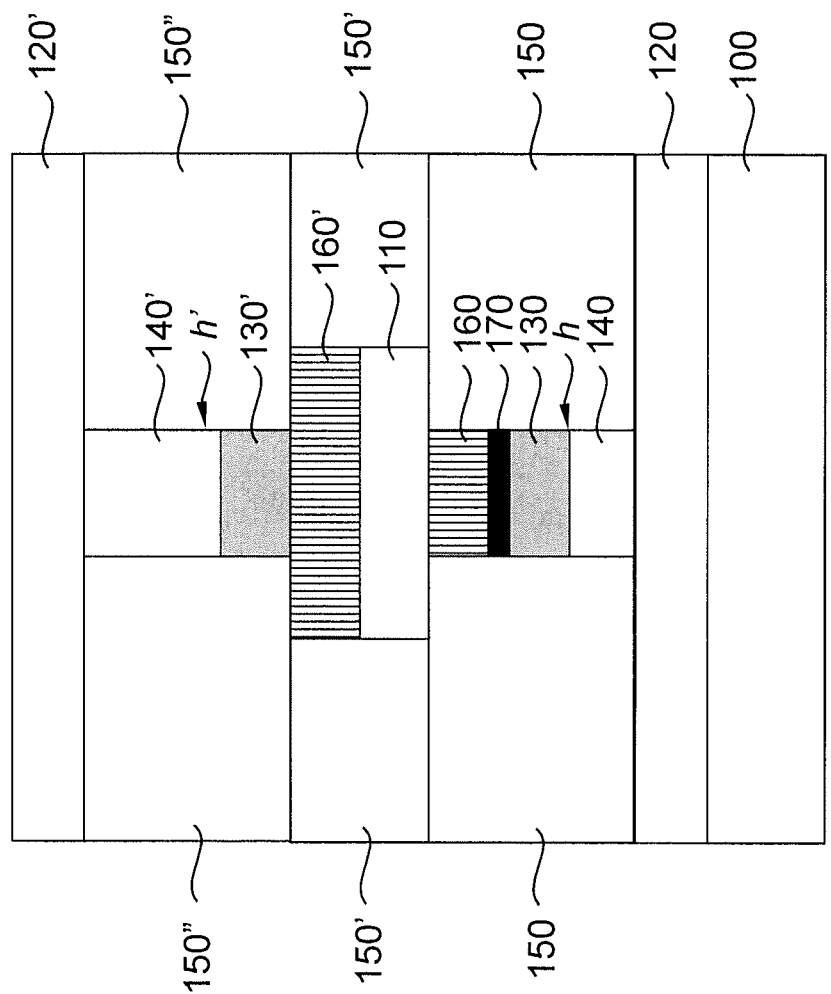
FIG. 8(a) shows a cross-sectional view of a PCRAM according to another embodiment of the present disclosure.
Figure 8B:
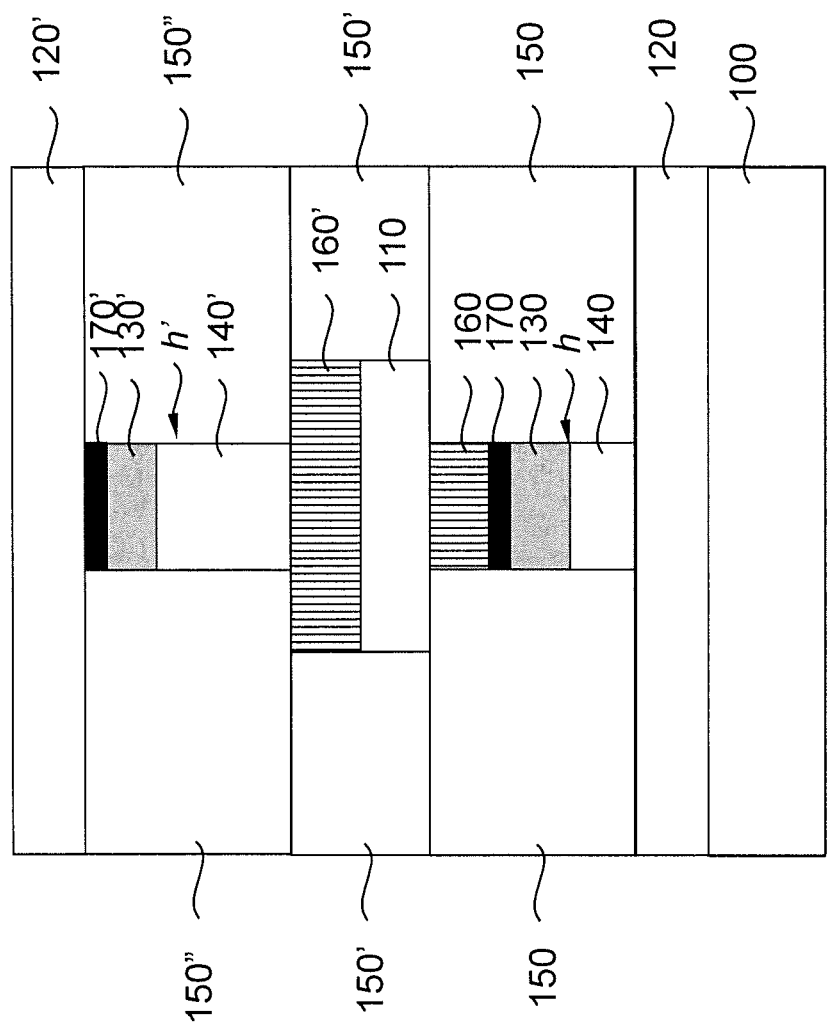
FIGS. 8(b), 8(c), and 8(d) show cross-sectional views of alternative embodiments of the PCRAM of FIG. 8(a).
Figure 8C:
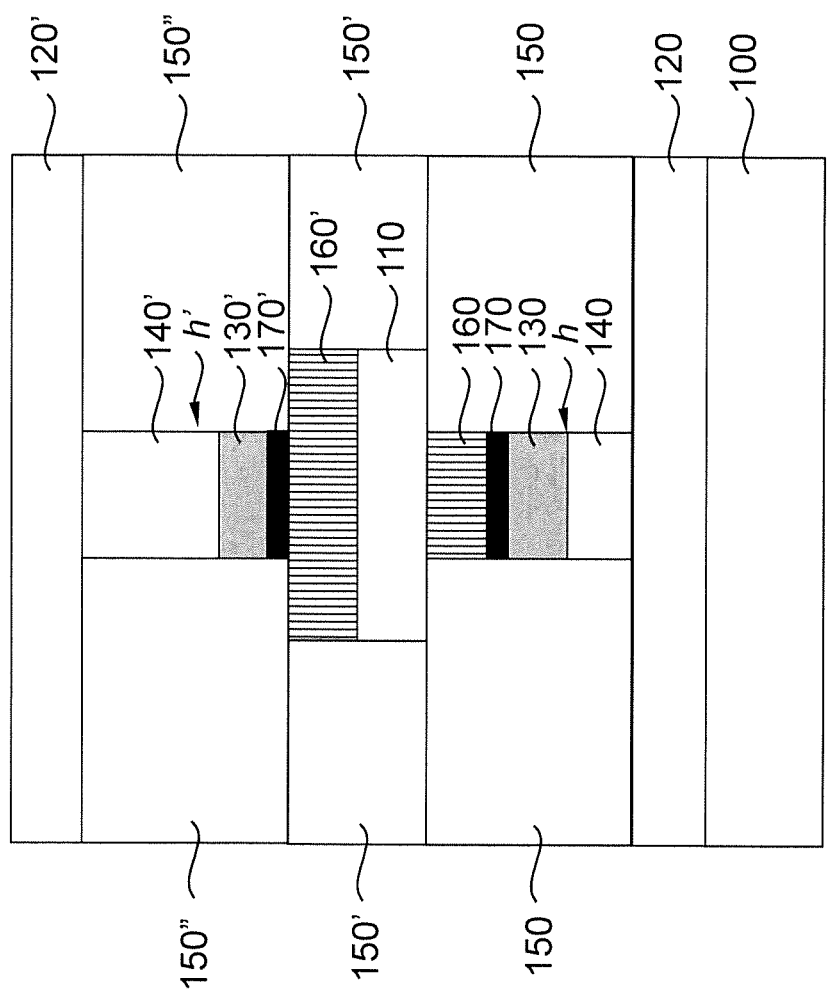
Figure 8D:
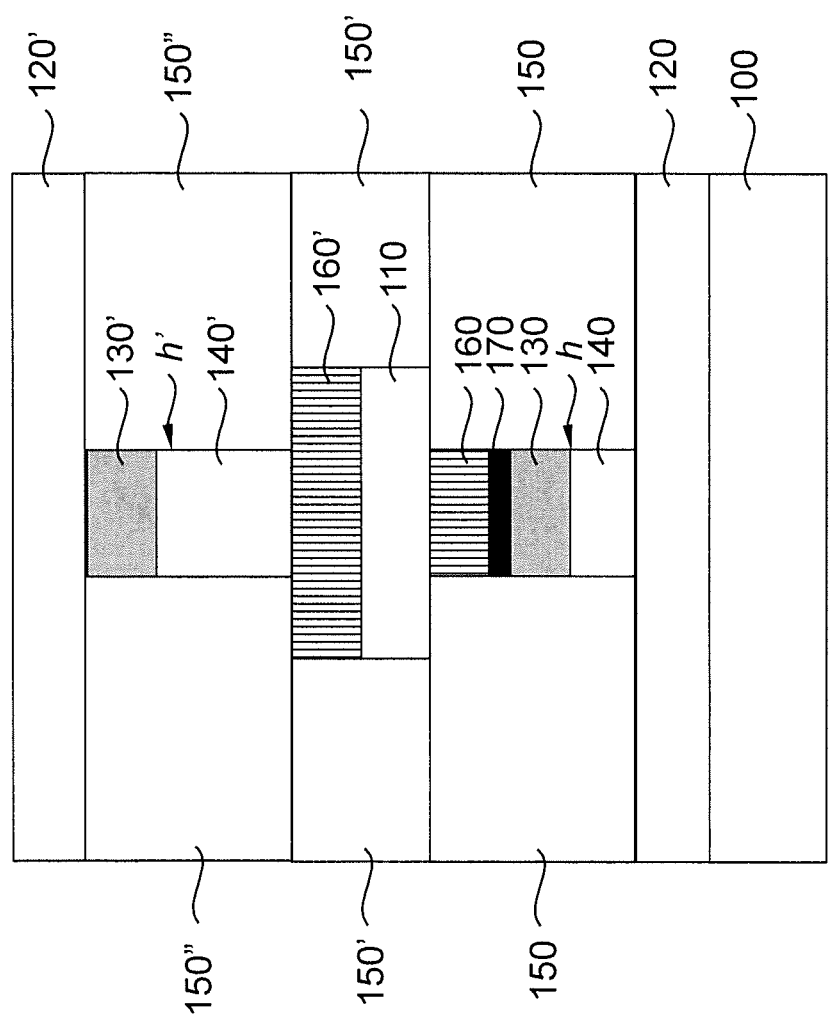

FIGS. 8(a), 8(b), 8(c), and 8(d) show embodiments having an additional component, i.e. an intermediate layer 170. FIGS. 8(a) and 8(d) show that the intermediate layer 170 is formed in the through hole h, between the phase change material layer 130 and the selector layer 160. In some embodiments, the intermediate layer 170 is formed of carbon or tungsten and functions to prevent material diffusion into and contamination of the phase change material layer 130. FIG. 8(a) shows the second phase change material layer 130' is formed between the second heater 140' and the second selector layer 160'. FIG. 8(b) shows that the second phase change material layer 130' is formed over the second heater 140' between the second heater 140' and the top electrode 120'. Depending on the heat transfer direction, either one of the embodiments of FIGS. 8(a) and 8(d) may enhance the overall efficiency of the PCRAM device.

FIGS. 8(b) and 8(c) show other embodiments having second intermediate layers 170' formed in the second through hole h'. FIG. 8(b) shows the second intermediate layer 170' is formed between the second phase change material layer 130' and the top electrode 120' to prevent material diffusion from the top electrode 120' into the second phase change material layer 130' from contaminating and changing the property of the second phase change material layer 130' in some embodiments. FIG. 8(c) shows the second intermediate layer 170' formed between the second phase change material layer 130' and the second selector layer 160' to prevent material diffusion from the selector layer 160' into the second phase change material layer 130' from contaminating and changing the property of the second phase change material layer 130' in some embodiments. In some embodiments, the intermediate layers 170 and 170' can be formed by any chemical vapor deposition (CVD), pulsed laser deposition (PLD), sputtering, atomic layer deposition (ALD) or any other thin film deposition method.

FIGS. 9(a)-9(f), 10(a)-10(i), 11(a)-11(h), and 12(a)-12(g) show the various manufacturing operations to make PCRAMs according to the above embodiments. It is understood that additional operations can be provided before, during, and after processes shown by FIGS. 9(a)-9(f), 10(a)-10(i), 11(a)-11(h), and 12(a)-12(g) and some of the operations described below can be replaced or eliminated, for additional embodiments of the methods. The order of the operations/processes may be interchangeable.

FIG. 9(a) shows an operation of forming a bottom electrode 120 over a substrate 100. In some embodiments, the substrate 100 is any substrate that can be used for an electronic memory device, including a single crystalline semiconductor material such as, but not limited to, Si, Ge, SiGe, GaAs, InSb, GaP, GaSb, InAlAs, InGaAs, GaSbP, GaAsSb and InP. In certain embodiments, the substrate 100 is made of crystalline Si. In some embodiments, the bottom electrode 120 is formed by evaporation or any vapor deposition method such as chemical vapor deposition (CVD), pulsed laser deposition (PLD), sputtering, atomic layer deposition (ALD) or any other thin film deposition method. The bottom electrode 120 can be formed by patterning the formed layer using masking and etching processes such as UV photolithography. To enhance the insulating property between the PCRAM devices or cells, an insulating layer of e.g. silicon oxide is formed (by oxidation or any thin film deposition method) over the substrate 100 (not shown) before the bottom electrode 120 is formed on the substrate 100.

FIG. 9(b) shows an operation of forming an insulating layer 150 over the bottom electrode 120. The insulating layer 150 is a material selected from the group consisting of silicon oxide ($SiO_2$), silicon nitride ($Si_3N_4$), silicon oxynitride (SiON), SiOCN, SiCN, $Al_2O_3$, fluorine-doped silicate glass (FSG), a low-k dielectric material, and other suitable dielectric materials used in manufacturing semiconductor devices. In some embodiments, the insulating layer 150 is formed, for example, by chemical vapor deposition (CVD), such as low pressure chemical vapor deposition LPCVD, plasma-CVD or flowable CVD, pulsed laser deposition (PLD), sputtering, atomic layer deposition (ALD) or any other thin film deposition method.

FIG. 9(c) shows an operation of forming a patterned photoresist layer 200 over the insulating layer 150. FIG. 9(d) shows an operation of etching the insulating layer 150 using isotropic etching, wet etching and/or dry etching. The etching forms a through hole h having a width of about 10 nm in the insulating layer 150, exposing the bottom electrode layer 120.

FIG. 9(e) shows an operation of forming a heater 140 in the through hole h. The heater 140 is formed by depositing a metal alloy layer over the insulating layer 150, followed by a chemical mechanical polishing CMP in some embodiments so that the top surface of the heater 140 is coplanar with the top surface of the insulating layer 150. The heater layer 140 formed in FIG. 9(e) is further etched to reduce the thickness in the through hole h, i.e. forming the embodiments in FIGS. 9(f) and 9(g).

The embodiment in FIG. 9(e) is continued in processing in FIG. 10(a) to form a stacked PCRAM device shown in FIG. 10(i), in some embodiments. FIG. 10(a) shows the embodiment depicted in FIG. 9(e). FIG. 10(b) shows an operation of forming a patterned phase change material layer 130 over the heater 140 by one or more thin film deposition and patterning methods. FIG. 10(c) shows an operation of forming a patterned selector layer 160 by one or more thin film deposition and patterning methods. FIG. 10(d) shows an operation of forming a metal layer 110 over the selector layer 160 by a thin film deposition and patterning method. Alternatively, in other embodiments, the three layers 130, 160 and 110 are formed together by forming the three layers and then patterning the three layers in single step. FIG. 10(e) shows an operation of forming and patterning the second selector layer 160' and the second phase change material layer 130' over the metal layer 110. In some embodiments, the layers 130, 160, 110, 160' and 130' are patterned by more than one etching processes. FIG. 10(f) shows an operation of forming the insulating layer 150'. FIG. 10(g) shows an operation of forming a second through hole h' by forming photoresist layer and etching an insulating layer 150". In some embodiments, the insulating layers 150' and 150" are formed as one layer in one operation instead of two layers formed in two separate operations. Through hole h' is subsequently formed by etching the one insulating layer. In some embodiments, the insulating layers 150, 150' and 150" are formed of the same materials described above. FIG. 10(h) shows an operation of forming a second heater 140'. FIG. 10(i) shows an operation of forming a top electrode 120'. In this way, in the formed device in FIG. 10(i), the insulating layers 150, 150', and 150", together with the top electrode 120' and the bottom electrode 120, enclose the other components in this device, providing superior electrical and thermal insulating properties and reducing thermal and cross-talk disturbance.

The embodiment in FIG. 9(f) is continued in processing in FIG. 11(a) to form the embodiment in FIG. 11(h) in some embodiments, and the embodiment in FIG. 9(g) is continued in processing in FIG. 12(a) to form the embodiment in FIG. 12(g) in other embodiments. FIG. 11(a) shows the embodiment depicted in FIG. 9(f). FIG. 11(b) shows an operation of forming a phase change material layer 130 in the through hole h and over the heater 140 by one or more thin film deposition methods. FIG. 11(c) shows an operation of forming a patterned selector layer 160 and a metal layer 110 by one or more thin film deposition and patterning methods. FIG. 11(d) shows an operation of forming a second selector layer 160' by one or more thin film deposition and patterning methods. Alternatively, in other embodiments, the three layers 160, 110 and 160' are formed by thin film deposition methods and then patterned together using a patterning method. FIG. 11(e) shows an operation of forming the insulating layer 150'. FIG. 11(f) shows an operation of forming a second through hole h'. The second through hole h' is formed by photolithography and etching operations in some embodiments. In some embodiments, the insulating layers 150, 150' and 150" are formed of the same material described above. Also, in some embodiments, the insulating layers 150' and 150" are formed as one layer formed in one operation. FIG. 11(g) shows an operation of forming a second heater 140' in the second through hole h'. FIG. 11(h) shows an operation of forming a top electrode 120'. In this way, in the formed device in FIG. 11(h), the insulating layers 150, 150' and 150", together with the top electrode 120' and the bottom electrode 120, enclose the other components in this device, thereby providing superior electrical and thermal insulating properties and reducing thermal and cross-talk disturbance.

FIG. 12(a) shows the embodiment depicted in FIG. 9(g). FIG. 12(b) shows an operation of forming a first phase change material layer 130 and a first selector layer 160 in the through hole h and over the heater 140 by one or more thin film deposition and patterning methods. FIG. 12(c) shows an operation of forming patterned metal layer 110 and patterned second selector layer 160' by one or more thin film deposition and patterning methods. Alternatively, in other embodiments, the layers 110 and 160' are formed and then patterned together using a patterning method. FIG. 12(d) shows an operation of forming the insulating layer 150'. FIG. 12(e) shows another operation of forming a second through hole h' in the insulating layer 150" using photolithography and etching operations in some embodiments. In some embodiments, the insulating layers 150' and 150" are formed as one layer formed in a single operation. FIG. 12(f) shows an operation of forming a second heater 140' in the second through hole h'. FIG. 12(g) shows an operation of forming a top electrode 120'. In some embodiments, the insulating layers 150, 150' and 150" are formed of the same materials described above. In this way, in the device in FIG. 12(g), the insulating layers 150, 150', and 150", together with the top electrode 120' and the bottom electrode 120, enclose the other components in this device, thereby providing superior electrical and thermal insulating properties and reducing thermal and cross-talk disturbance.

Figure 13:
FIG. 13 shows a method of forming a PCRAM according to embodiments of the present disclosure.

FIG. 13 shows a flowchart of a method of forming an embodiment of the present disclosure. The method includes operations S131: forming a bottom electrode over a substrate, S132: forming an insulating layer over the bottom electrode, S133: forming a through hole in the insulating layer, S134: forming a heater in the through hole, S135: forming a phase change material layer over the heater, S136: forming a selector layer over the phase change material layer, and S137: forming a metal layer over the selector layer. In particular, the operation S135 may include forming the phase change material layer over the insulating layer and over the heater, or forming the phase change material layer in the through hole of the insulating layer and over the heater. Also, the operation S136 may include forming the selector layer over the insulating layer and over the heater or forming the selector layer in the through hole of the insulating layer and over the heater. The process conditions of each operation include the details of the embodiments disclosed herein.

An embodiment according to the present disclosure includes a memory device having a substrate, a bottom electrode disposed over the substrate, and an insulating layer disposed over the bottom electrode. The insulating layer has a through hole defined in the insulating layer. A heater is disposed in the through hole. A phase change material layer is disposed over the heater. A selector layer is disposed over the phase change material layer, and a metal layer disposed over the selector layer. In some embodiments, the metal layer is formed to be wider than the phase change material layer. In some embodiments, the phase change material layer is disposed in the through hole. In some embodiments, the selector layer is disposed in the through hole. In some embodiments, an intermediate layer between the phase change material layer and the selector layer is included in the memory device. In some embodiments, the intermediate layer is formed of one of carbon and tungsten. In some embodiments, the metal layer functions as an upper electrode.

Another embodiment according to the present disclosure includes a memory device having a substrate, a bottom electrode disposed over the substrate, and a first heater disposed over the bottom electrode. A first phase change material layer is disposed over the first heater. A first selector layer is disposed over the first phase change material layer. A metal layer is disposed over the first selector layer. A second selector layer disposed over the metal layer. A second heater and a second phase change material layer are disposed over the second selector layer. An upper electrode is disposed over the second heater and the second phase change material layer, and an insulating layer between the bottom electrode and the upper electrode, encloses, with the bottom and upper electrodes, the first and second heaters, the first and second selector layers, the first and second phase change material layers, and the metal layer. In some embodiments, the metal layer is formed to be wider than the first phase change material layer. In some embodiments, the second heater is disposed over the second phase change material layer. In some embodiments, the second phase change material layer is disposed over the second heater. In some embodiments, the second selector layer is formed to be wider than the first selector layer. In some embodiments, an intermediate layer is disposed between the first phase change material layer and the first selector layer. In some embodiments, the intermediate layer is formed of one of carbon and tungsten.

Another embodiment according to the present disclosure is a method of manufacturing a memory device. The method includes forming a bottom electrode over a substrate, forming an insulating layer over the bottom electrode, and forming a through hole in the insulating layer. A heater is formed in the through hole. A phase change material layer is formed over the heater. A selector layer is formed over the phase change material layer, and a metal layer is formed over the selector layer. In some embodiments, the metal layer is formed to be wider than the phase change material layer. In some embodiments, the phase change material layer is formed in the through hole. In some embodiments, the selector layer is disposed in the through hole. In some embodiments, the method includes forming a second selector layer over the metal layer, forming a second heater and a second phase change material layer over the second selector layer, and forming an upper electrode over the second heater and the second phase change material layer, wherein the insulating layer between the bottom electrode and the upper electrode, encloses, with the bottom and upper electrodes, the heaters, the selector layers, the phase change material layers, and the metal layer. In some embodiments, the selector layers are formed to have different widths.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device comprising:
   a substrate;
   a bottom electrode disposed over the substrate;
   an insulating layer disposed over the bottom electrode, the insulating layer having a through hole defined in the insulating layer;
   a heater disposed in the through hole;
   a phase change material layer disposed over the heater;
   a selector layer consisting of at least one selected from the group consisting of $SiO_x$, $TiO_x$, $AlO_x$, $WO_x$, $Ti_xN_yO_z$, $HfO_x$, $TaO_x$, and $NbO_x$, where x, y and z are non-stoichiometric values, AsGeSe doped with one or more elements of N, P, S, Si or Te, and AsGeSeSi doped with one or more elements of N, P, S, Si or Te, and disposed on and in direct contact with the phase change material layer; and
   a metal layer disposed over the selector layer.

2. The memory device of claim 1, wherein the metal layer is wider than the phase change material layer.

3. The memory device of claim 1, wherein the phase change material layer is disposed in the through hole.

4. The memory device of claim 3, wherein the selector layer is disposed in the through hole.

5. The memory device of claim 1, wherein the metal layer functions as an upper electrode.

6. A memory device comprising:
   a substrate;
   a bottom electrode disposed over the substrate;
   a first heater disposed over the bottom electrode;
   a first phase change material layer disposed over the first heater;
   a first selector layer consisting of at least one selected from the group consisting of $SiO_x$, $TiO_x$, $AlO_x$, $WO_x$, $HfO_x$, $TaO_x$, and $NbO_x$, where x, y and z are non-stoichiometric values, AsGeSe doped with one or more elements of N, P, S, Si or Te, and AsGeSeSi doped with one or more elements of N, P, S, Si or Te, and disposed on and in direct contact with the first phase change material layer;
   a metal layer disposed over the first selector layer;
   a second selector layer disposed over the metal layer;
   a second heater and a second phase change material layer disposed over the second selector layer;
   an upper electrode disposed over the second heater and the second phase change material layer; and
   an insulating layer between the bottom electrode and the upper electrode, enclosing, with the bottom and upper electrodes, the first and second heaters, the first and second selector layers, the first and second phase change material layers, and the metal layer.

7. The memory device of claim 6, wherein the metal layer is wider than the first phase change material layer.

8. The memory device of claim 6, wherein the second heater is disposed over the second phase change material layer.

9. The memory device of claim 6, wherein the second phase change material layer is disposed over the second heater.

10. The memory device of claim 6, wherein the second selector layer is wider than the first selector layer.

11. The memory device of claim 6, wherein the second selector layer consists of at least one selected from the group consisting of $SiO_x$, $TiO_x$, $AlO_x$, $WO_x$, $TiO_xN_yO_z$, $HfO_x$, $TaO_x$ and $NbO_x$, where x, y and z are non-stoichiometric values, AsGeSe doped with one or more elements of N, P, S, Si or Te, and AsGeSeSi doped with one or more elements of N, P, S, Si or Te, and is in direct contact with the second phase change material layer.

12. A memory device comprising:
    a lower wiring disposed over a. substrate;
    an upper wiring;
    a first interlayer dielectric (ILD) layer disposed between the lower wiring and the upper wiring; and
    a memory cell disposed between the lower wiring and the upper wiring, wherein:
    the memory cell includes:
    a heater disposed over a the lower wiring;
    a phase change material layer disposed over the heater;
    a selector layer disposed over the phase change material layer;

a metal layer disposed over the selector layer; and
an intermediate layer between the phase change material layer and the selector layer,
the heater, the phase change material layer and the intermediate layer are disposed in a hole formed in in the first ILD layer and the metal layer is disposed on an upper surface of the first ILD layer and laterally extending beyond the hole on the upper surface,
a second ILD layer is disposed on the upper surface of the first ILD layer, and the metal layer is embedded in the second ILD layer,
the intermediate layer consists of tungsten, and
the selector layer consists of at least one selected from the group consisting of $SiO_x$, $TiO_x$, $AlO_x$, $WO_x$, $Ti_xN_yO_z$, $HfO_x$, $TaO_x$, and $NbO_x$, where x, y and z are non-stoichiometric values, AsGeSe doped with one or more elements of N, R S, Si or Te, and AsGeSeSi doped with one or more elements of N, P, S, Si or Te, and disposed on and in direct contact with the first phase change material layer.

13. The memory device of claim 12, wherein the selector layer is disposed on the upper surface of the first HD layer and laterally extending beyond the hole on the upper surface.

14. The memory device of claim 12, wherein the selector layer is disposed in the hole.

15. The memory device of claim 12, wherein the selector layer consists of at least one selected from the group consisting of $SiO_x$, $TiO_x$, $AlO_x$, $WO_x$, $Ti_xN_yO_z$, $HfO_x$, $TaO_x$ and $NbO_x$, where x, y and z are non-stoichiometric values.

16. The memory device of claim 12, wherein the selector layer consists of at least one of AsGeSe doped with one or more elements of N, P, S, Si and Te and AsGeSeSi doped with one or more elements of N, P, S, Si and Te.

17. The memory device of claim 12, wherein the selector layer consists of at least one selected from the group consisting of AsGeSe doped with one or more elements of N, P, S, Si or Te.

18. The memory device of claim 12, wherein a thickness of the intermediate layer is 1 nm to 50 nm.

* * * * *